(12) United States Patent
Kajimoto

(10) Patent No.: US 7,903,460 B2
(45) Date of Patent: Mar. 8, 2011

(54) NON-VOLATILE SEMICONDUCTOR MEMORY DEVICE

(75) Inventor: Takeshi Kajimoto, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 63 days.

(21) Appl. No.: 12/398,794

(22) Filed: Mar. 5, 2009

(65) Prior Publication Data
US 2009/0244976 A1 Oct. 1, 2009

(30) Foreign Application Priority Data

Apr. 1, 2008 (JP) ................................ 2008-095226

(51) Int. Cl.
G11C 16/04 (2006.01)
(52) U.S. Cl. .......... 365/185.11; 365/185.29; 365/185.18; 365/185.23
(58) Field of Classification Search ............. 365/185.11, 365/185.29, 185.18, 185.23
See application file for complete search history.

(56) References Cited

U.S. PATENT DOCUMENTS 5,798,547 A    8/1998  Urai
6,574,149 B2 * 6/2003  Einaga et al. ............ 365/185.29
2002/0085416 A1  7/2002  Yamagami et al.
2006/0013043 A1 * 1/2006  Matsuoka ................ 365/185.09
2007/0014152 A1 * 1/2007  Shibata et al. ........... 365/185.11

FOREIGN PATENT DOCUMENTS

JP    6-124596      5/1994
JP    9-153292      6/1997
JP    2000-298992   10/2000

* cited by examiner

Primary Examiner — Hoai V Ho
Assistant Examiner — Fernando N Hidalgo
(74) Attorney, Agent, or Firm — McDermott Will & Emery LLP

(57) ABSTRACT

The present invention provides a non-volatile memory capable of realizing erase/write operations in sufficiently small division units while suppressing an increase in chip area to the minimum, and shortening an erase time. Two of a physical erase state and a logical erase state are provided as threshold voltage distribution states of each memory cell. In the logical erase state, a threshold voltage criterion of the memory cell is shifted to a state higher than the physical erase state. When data rewriting of the memory cell placed in the physical erase state is performed, a logical erase is performed and the threshold voltage criterion is shifted to a high voltage level. The logical erase simply shifts the voltage level of the threshold voltage criterion. Since an electrical charge accumulated in the memory cell is not moved, erasing can be done at high speed and in a short period of time.

4 Claims, 32 Drawing Sheets

FIG. 4

| WORD LINE ADDRESS | ERASE STATE | WRITE STATE |
|---|---|---|
| × × · · · · × × | 0/1 | 0/1 |
| ⋮ | ⋮ | ⋮ |
| × × · · · · × × | 0/1 | 0/1 |

7a, 7b, 7c (components of 7)

0: PHYSICAL ERASE STATE
1: LOGICAL ERASE STATE

0: NON-WRITE
1: WRITE

FIG. 22

| LOGICAL ADDRESS (PROCESSOR ADDRESS) 111 | PHYSICAL ADDRESS (IN-MEMORY ADDRESS) 112 | ERASE STATE FLAG EF 113 | SECTOR STATUS FLAG SVF 114 | BLOCK STATUS FLAG BVF 115 |
|---|---|---|---|---|
| x······xx | xx······xx | LOGICAL/PHYSICAL | VALID/INVALID/WRITE | VALID/INVALID LOGICAL/PHYSICAL ERASE |
| ··· | ··· | ··· | ··· | ··· |
| ··· | ··· | ··· | ··· | ··· |

110A: {111, 112}
110B: {113, 114, 115}
110

REFER TO ADDRESS

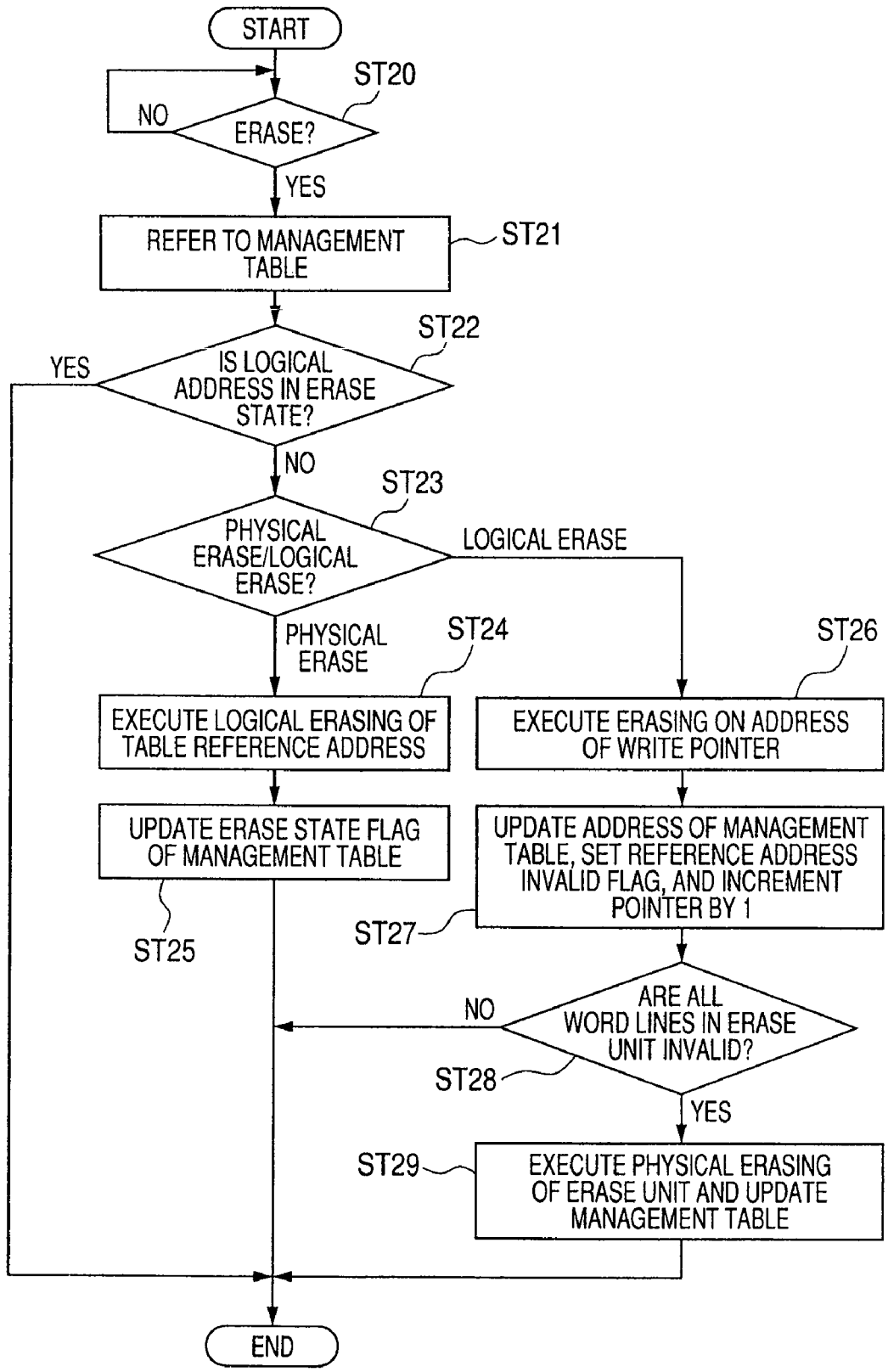

NON-VOLATILE SEMICONDUCTOR MEMORY DEVICE

CROSS-REFERENCE TO RELATED APPLICATIONS

The disclosure of Japanese Patent Application No. 2008-95226 filed on Apr. 1, 2008 including the specification, drawings and abstract is incorporated herein by reference in its entirety.

BACKGROUND OF THE INVENTION

The present invention relates to a non-volatile semiconductor memory device, and particularly to a non-volatile semiconductor memory device built in a processor such as a microcomputer. More particularly, the present invention relates to a configuration which performs writing and erasing of a non-volatile semiconductor memory device.

One flash memory corresponding to a non-volatile semiconductor memory device has heretofore been used mainly independently in applications or the like which store a control program and data of a cellular phone. In order to store a control program and data of a microcomputer, however, applications in the form of the flash memory being built in the microcomputer have been widened in recent years.

The microcomputer having built such a flash memory therein needs to realize a memory having required minimum memory capacity in as small an area as possible in terms of a limitation to a chip size. Since the microcomputer having built such a flash memory therein is used in various applications, there is a need to develop a wide variety of microcomputer products in a common platform. Therefore, in order to meet diversified programs, it is desired that division units of a program storage area of the flash memory can be changed flexibly. The change of the division units corresponding to the program size means such a configuration that if descried concretely, erase and write operations are performed in division units of small memory capacity ranging from about 128 bytes to 1K bytes.

A flash memory cell stores therein data according to the amount of electrical charge accumulated in its floating gate. Thus, the flash memory needs to execute erasing on a target memory cell before the writing of data. Upon the erase operation, the difference in potential between each well and a control gate is utilized. Thus, a reduction in erase unit means that a memory cell array area with memory cells arranged therein is divided into a plurality of small areas by wells. In this case, the area increases by well separation, thus resulting in contradiction to small area requirements that need for built-in applications.

One example of a method for increasing the number of erase units without increasing a well's division number has been shown in a patent document 1 (Japanese Unexamined Patent Publication No. Hei 09(1997)-153292). In the configuration shown in the patent document 1, a voltage of the same level as a well potential is applied to word lines arranged with respect to memory cells lying in non-selected rows. In each of the memory cells lying in the non-selected rows, its control gate and well become the same potential, and the transfer of electric charge between its floating gate and well is prohibited. Thus, the erase unit is set to a word line unit.

In the flash memory, a high voltage is applied to the corresponding memory cell upon erasing, so that deterioration of an insulating film located below the floating gate occurs. One example of a configuration for achieving suppression of degradation of each memory cell by such erasing has been shown in a patent document 2 (Japanese Unexamined Patent Publication No. 2000-298992). In the patent document 2, data translation is performed in a flash memory cell that stores multivalued data therein, and an area highest in threshold voltage and an area close to it are used for data storage. Using the limited area of the threshold voltage areas that store the multivalued data therein, the amount of electrical charge that passes through the insulating film lying below the floating gate is reduced and deterioration of the insulating film is suppressed during a data rewriting cycle.

The microcomputer with the flash memory built therein is different from a microcomputer utilizing a conventional mask ROM (Read-Only Memory) as a program memory. A control program can be changed on an on-board at a delivery destination. Speeding-up with respect to erasing and writing of the control program is required.

A configuration for realizing high-speed writing in a flash memory has been shown in a patent document 3 (Japanese Unexamined Patent Publication No. He 06(1994)-124596). In the configuration shown in the patent document 3, a memory cell array is divided into a plurality of sectors. Upon data rewriting, sectors each placed in a non-written state or a sector lowest in the number of erases is extracted and the rewriting of data is executed thereon. Deterioration of memory cell characteristics of each sector due to the concentration of erasing on specific sectors is suppressed. Since data is written into a new sector, easing of the new sector becomes unnecessary upon rewriting, and the writing of data can be executed at high speed.

SUMMARY OF THE INVENTION

As the erase operation in the flash memory, a method for applying a high voltage between a control gate and a well and discharging electrons from the floating gate to the well using an FN tunnel phenomenon (Folwer-Nordheim tunnel phenomenon) is general. According to this operation, several tens of thousands to hundreds of thousands of memory cells arranged within one well can be collectively erased.

Enabling erasing such several tens of thousands to hundreds of thousands of memory cells collectively is effective for a NAND type flash memory used for the purpose of storing large volumes of data. However, in NOR type flash memories different in control program to be stored every used apparatus or application, this batch erasure in the well unit might not necessarily be effective. In particular, a NOR type flash memory built in each microcomputer product needs to erase/re-set a plurality of control programs separately. Since their program sizes widely range depending on applications in which the microcomputer products are used. Therefore, such a configuration that a plurality of small erase units comprised of a few thousands of memory cells are provided in large numbers and respectively erased separately, becomes effective. When, however, the erase units are provided in well units, sufficient space is ensured in consideration of a breakdown voltage and a well needs to be divided in large numbers, thereby increasing a chip area.

The method shown in the patent document 1 is capable of reducing the number of divided wells. However, word lines intended for non-erasure need to be driven to a high voltage of the same degree as a well potential. Thus, the smaller the erase unit in a well division unit, the more the ratio that the area intended for non-erasure increases. Correspondingly, a problem arises in that power consumption increases. The number of times that each word line is driven to the high voltage increases, thus causing a high possibility that deterioration of each word line will occur.

The NOR type flash memory is different from an EEPROM (electrically erasable programmable ROM). Each memory cell is comprised of one transistor. Since no selection transistor is provided in the memory cell, there is a need to avoid "overerase" upon the erase operation of the NOR type flash memory. Namely, there is a need to avoid the problem that the threshold voltage of the memory cell is reduced upon erasing and it is brought to a conducting state even in a non-selected state, so that data of other memory cells coupled to the same bit line cannot be read properly upon data reading. Thus, when several tens of thousands to hundreds of thousands of memory cells are collectively erased, it is necessary to distribute all memory cells intended for erasure within a certain constant threshold voltage range. Therefore, there is a need to repeatedly execute erase/write by performing verify. A problem arises in that the erase time reaches even a few hundred ms and the time necessary for rewriting becomes longer.

In the configuration shown in the patent document 2, some distribution area of the threshold voltage distribution used to store multivalued data is utilized. Although the problem of "overerase" can be avoided in the case of this configuration, there is a need to perform data translation upon rewriting thereby to decide a write threshold voltage distribution area. It is further necessary to perform erasing and writing, thus causing a problem in that time is required for rewriting. In the patent document 2, no consideration is given to a configuration in which an erase unit is changed.

In the method shown in the patent document 3, the data has been written into each sector placed in the non-written state upon rewriting, and hence the speeding-up of data writing is enabled. Even in the patent document 3, however, the erase unit is fixed and no consideration is given to such a configuration that the erase unit can be changed. Since each sector subjected to the rewriting is replaced with a new sector, the previous sector is invalidated. When the sectors lying within one block are all brought to an invalid state, erasing is executed on the corresponding block. Thus, when the number of extra sectors/blocks in which data are newly written, is small, the number of times that erasing in block units is performed increases and the possibility of memory cell characteristics being deteriorated will increase. Particularly in the case of utilization to each application which stores data large in the number of rewritings such as application data, a reduction in the number of erases and a reduction in the number of extra sectors/blocks become contradictory requests.

Therefore, an object of the present invention is to provide a non-volatile semiconductor memory device capable of making erase units smaller without increasing a chip size, performing writing at low power consumption and high-speed and reducing the number of times that an erase voltage is applied to each memory cell.

A non-volatile semiconductor memory device according to the present invention includes first and second erase units as erase units. The first erase unit is comprised of a plurality of second erase units. When rewriting to each second erase unit including a selected memory cell is designated, the second erase unit is erased by a second erase control unit upon a state in which the second erase unit has been erased by a first erase control unit. The voltage that the second erase control unit uses upon erasing is smaller in absolute value than the maximum voltage used in the first erase control unit upon erasing, and the time necessary for erasure is also short.

The first and second erase units are provided as erase units. Thus, the erasing is executed in the second erase unit thereby to make it possible to perform erasing in small erase units without increasing the number of the first erase units and enable adaptation to various applications without causing an increase in the area.

Upon erasing in the second erase unit, the voltage in absolute value smaller than the maximum applied voltage at erasing in the first erase unit is simply utilized. Thus, power consumption can be reduced. Further, the applied voltage is low and the application of a large voltage to each memory cell at erasing can be suppressed, thereby making it possible to suppress degradation of each memory cell. The time necessary for the erasure of the second erase unit is shorter than that at the erasure in the first erase unit, and the time required for erasing can be shortened.

BRIEF DESCRIPTION OF THE DRAWINGS

FIG. 4 is a diagram showing one example of a configuration of an erase management table shown in FIG. 1;

FIG. 22 is a diagram schematically depicting a configuration of a management table employed in the second embodiment of the present invention;

FIG. 34 is a flow chart showing an operation sequence at erasing, of the non-volatile semiconductor memory device according to the third embodiment of the present invention.

DETAILED DESCRIPTION OF THE PREFERRED EMBODIMENTS

First Embodiment

Figure 1:
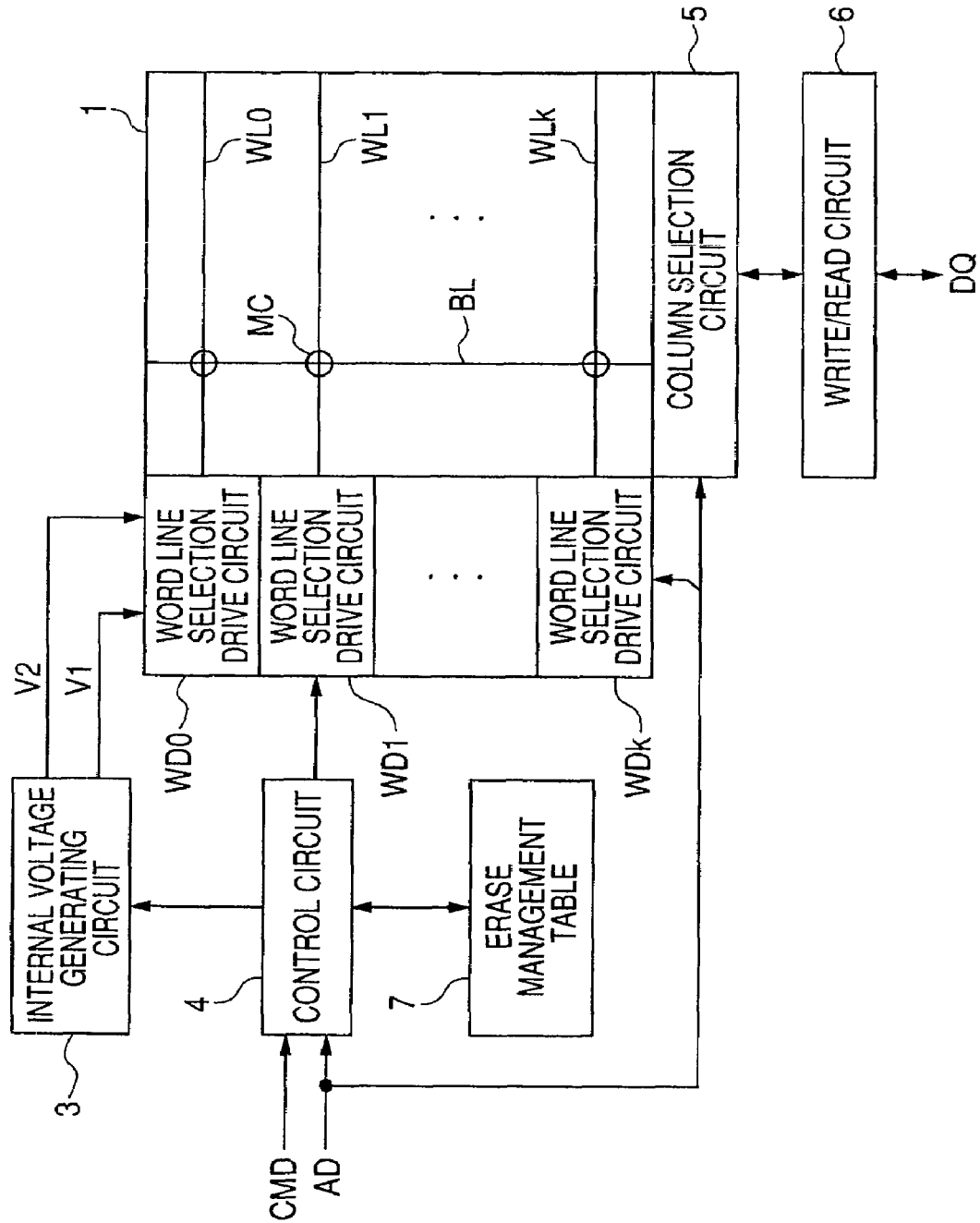
FIG. 1 is a diagram schematically showing an overall configuration of a non-volatile semiconductor memory device according to a first embodiment of the present invention.

FIG. 1 is a diagram schematically showing an overall configuration of a non-volatile semiconductor memory device according to a first embodiment of the present invention. In FIG. 1, the non-volatile semiconductor memory device includes a memory cell array 1 in which memory cells MC are arranged in matrix form. In the memory cell array 1, word lines WL are arranged corresponding to the respective rows of the memory cells MC and bit lines BL are arranged corresponding to the respective columns of the memory cells MC. Word lines WL0 through WLk and one bit line BL are shown in FIG. 1. Each of the memory cell MC is of a NOR type flash memory cell, which configuration will hereinafter be explained in detail.

Word line selection drive circuits WD0 through WDk are respectively provided corresponding to the word lines WL0 through WLk. The word line selection drive circuits WD0 through WDk respectively include word line address decode circuits and word line drive circuits and supply voltages each corresponding to an operation mode to their corresponding word lines. The word line selection drive circuits WD0 through WDk are respectively supplied with internal voltages V1 and V2 from an internal voltage generating circuit 5. Each of the word line selection drive circuits WD0 through WDk selects one of the internal voltages V1 and V2 according to an erase state (first erase state or second erase state) of each memory cell coupled to its corresponding word line.

The internal voltage generating circuit 3 generates voltages of predetermined levels according to the respective operation modes, i.e., read, write and verify operation modes under the control from a control circuit 4.

A column selection circuit 5 and a write/read circuit 6 are provided to execute reading and writing of data from and to each memory cell. The column selection circuit 5 selects each bit line of the memory cell array 1. The write/read circuit 6 includes a data register as one example, latches therein write data from outside upon writing and supplies a voltage corresponding to the write data to each bit line. Upon reading, the write/read circuit 6 supplies a bit line read voltage to the corresponding bit line of the selected column and detects current flowing through the bit line thereby to execute the reading of data.

An erase management table 7 is provided to manage the erase state of each memory cell MC in the memory cell array 1. The erase management table 7 manages in a second erase unit whether the erase state of each memory cell is either a first erase state or a second erase state. Upon erasing and writing (hereinafter both called "rewriting" together), the control circuit 4 identifies referring to the erase management table 7 whether the corresponding memory cell of a memory cell row designated by an address signal AD is in the first or second erase state, and executes rewriting according to the result of identification by the control circuit 4.

Here, the term of "first/second erase state" indicates a state in which a first or second erase has been executed before the writing of data into each memory cell and includes a state in which writing has been done subsequently.

Figure 2:
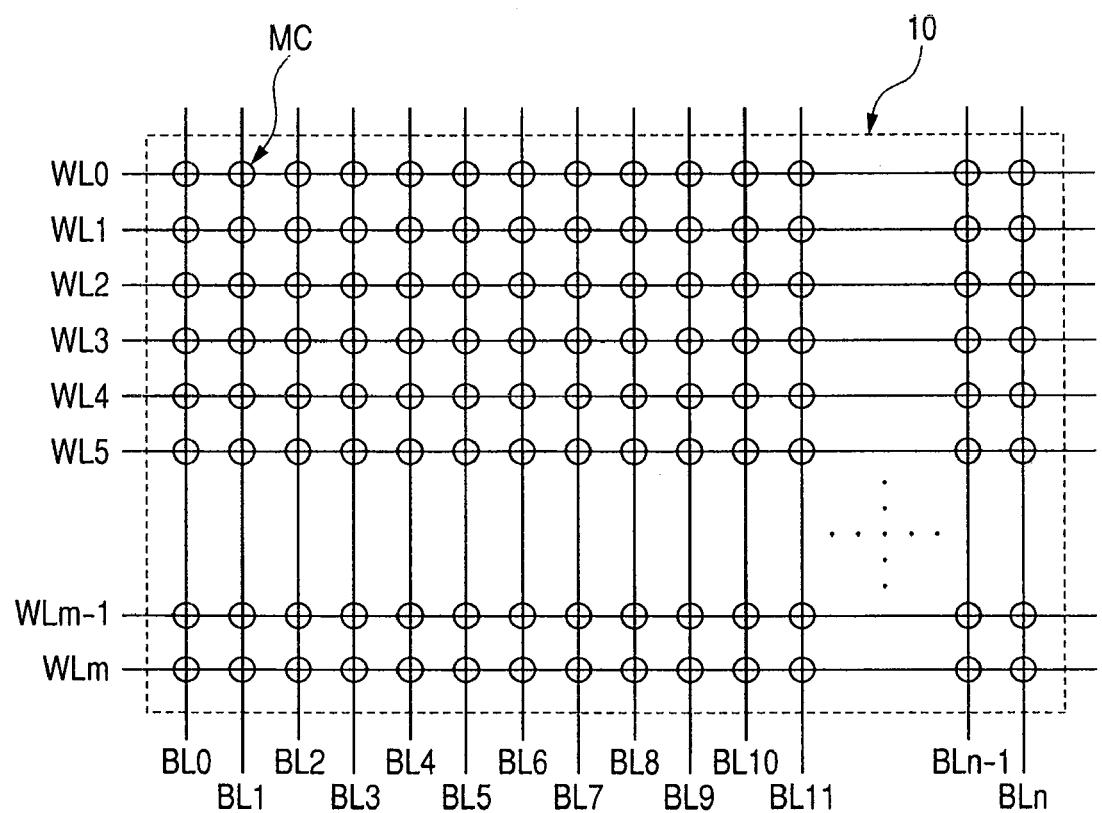
FIG. 2 is a diagram schematically illustrating one example of a configuration of a memory cell array shown in FIG. 1.

FIG. 2 is a diagram schematically showing erase units of the memory cell array 1 shown in FIG. 1. In FIG. 2, the memory cell array 1 is divided into one or plural wells 10. A plurality of word lines WL0 through WLm are arranged in each of the wells 10. At the well 10, bit lines BL0 through BLn are respectively provided corresponding to the columns of the memory cells MC.

In the first embodiment, erasing is executed in well 10 units or in word line units. A first erase unit corresponds to the well 10 and a second erase unit corresponds to each word line.

Figure 3:
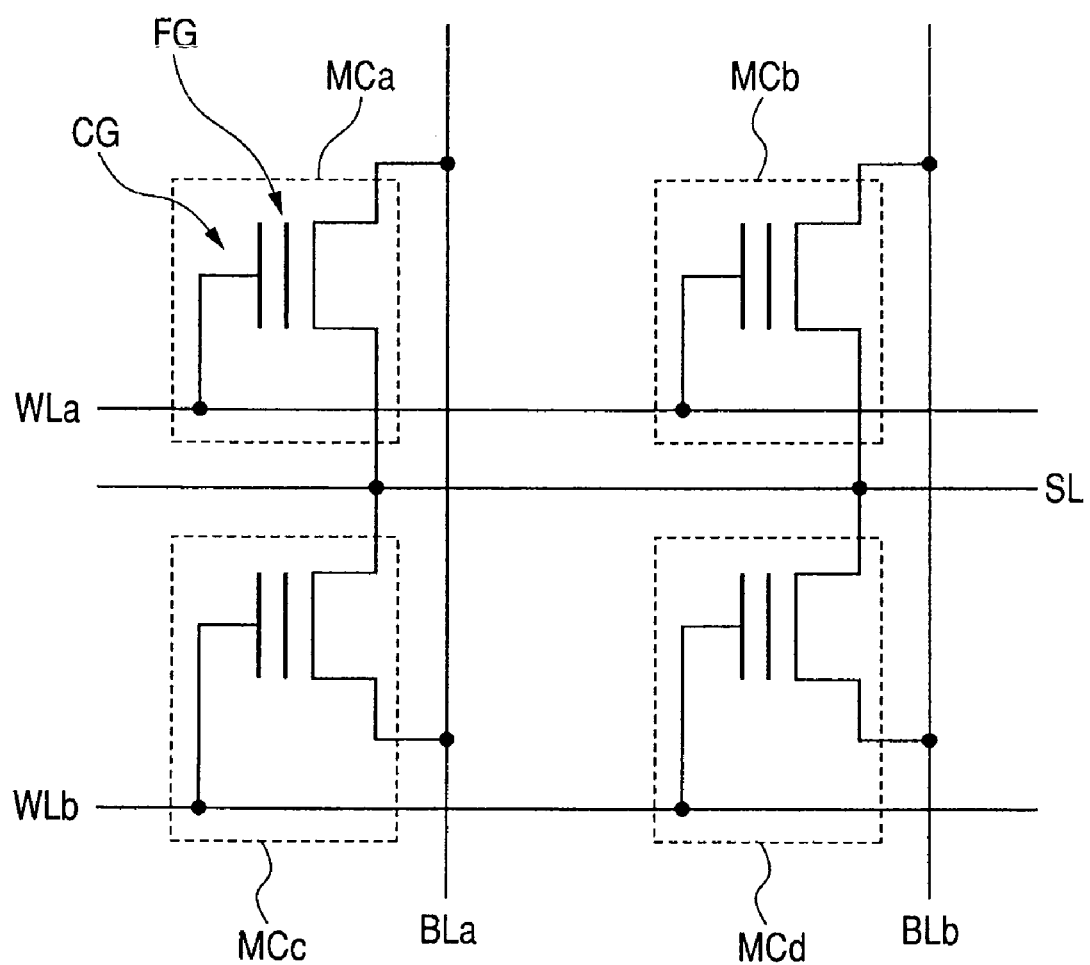
FIG. 3 is a diagram depicting one example of a concrete configuration illustrative of memory cells shown in FIG. 2.

FIG. 3 is a diagram showing one example of a concrete configuration illustrative of the memory cells MC shown in FIGS. 1 and 2. Memory cells MCa through MCd arranged in two rows and two columns are typically shown in FIG. 3. A word line WLa is coupled to control gates of the memory cells MCa and MCb. A word line WLb is coupled to control gates of the memory cells MCc and MCd. A bit line BLa is coupled to drain regions of the memory cells MCa and MCc. A bit line BLb is coupled to drain regions of the memory cells MCb and MCd. A source line SL is provided in common to these memory cells MCa through MCd. A source line SL is coupled in common to source regions of the memory cells MCa through MCd.

Each of the memory cells MCa through MCd comprises a stack-gate type transistor having a floating gate FG and a control gate CG. The floating gate FG is separated from other regions, and the threshold voltage of each memory cell transistor differs according to the amount of electrical charge (electrons) accumulated in the floating gate FG. The amount of current flowing via each memory cell differs according to the relationship between the voltage applied to the control gate CG and the threshold voltage of each memory cell. The amount of current flowing through each of the bit lines BL (BLa and BLb) is detected to perform the reading of data.

FIG. 4 is a diagram schematically showing a configuration of the erase management table 7 shown in FIG. 1. In FIG. 4, the erase management table 7 includes an area 7a for storing word line addresses therein, an area 7b for storing flags each indicative of an erase state therein and an area 7c for storing flags each indicative of a write state therein.

The respective word line addresses are stored in the word line address storage area 7a, and the flags each indicative of the erase state are stored in the erase state flag storage area 7b in association with the word line addresses. As one example, when the erase state flag is "0", it indicates a physical erase state (first erase state), and when the erase state flag is set to "1", it indicates a logical erase state (second erase state). This physical erase indicates the operation of pulling out electrons from the floating gate FG to the well side thereby to perform erasing as in the normal manner. The logical erase indicates the operation of simply shifting a voltage level of a data read criterion (threshold voltage criterion) of each memory cell without performing such pulling out of the electrons from the floating gate thereby to perform equivalent erasing. The read criterion indicates the voltage transmitted to each selected word line upon data reading. When the threshold voltage of the memory cell is higher than this read criterion voltage, current flowing through the memory cell becomes small (hardly flows therethrough), whereas when it is lower than the read criterion voltage, the amount of current flowing through the memory cell increases.

Flags each indicative of whether the corresponding word line is in a write state in association with each word line, are stored in the write state flag storage area 7c. When the write state flag is set to "0" by way of example, it indicates that the corresponding word line is in a non-write state and an erase state. When the write state flag is set to "1", it indicates that the corresponding word line is in the write state.

Figure 5:
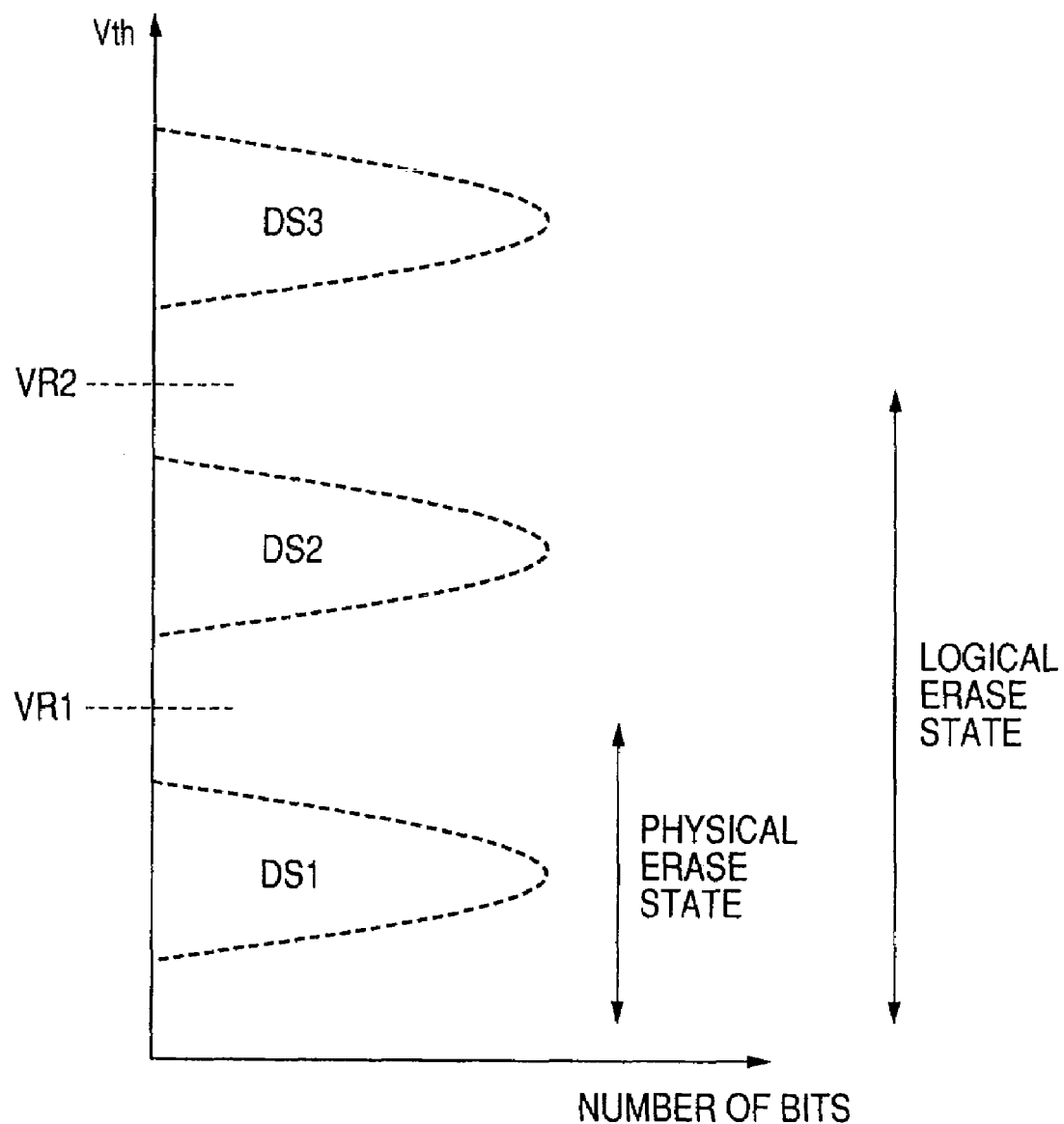
FIG. 5 is a diagram schematically showing one example illustrative of threshold voltage distributions of memory cells.

FIG. 5 is a diagram schematically showing one example illustrative of threshold voltage distributions of the memory cells MC. In FIG. 5, the threshold voltage distributions where the memory cells MC are capable of storing ternary data therein are shown by way of example. The memory cells MC may respectively have the capability of storing other multi-valued data such as quaternary or octonary data.

The threshold voltage distribution DS1 exists in a range in which the threshold voltage is lower than a read criterion voltage VR1 and higher than a ground voltage. The threshold voltage distribution DS2 exists between the read criterion voltages VR and VR2. The threshold voltage distribution DS3 exists in a range in which the threshold voltage is higher than the read criterion voltage VR2.

In a state after the physical erase has been executed, the threshold voltage of each memory cell exists in the area of the threshold voltage distribution DS1. When the writing of data is conducted, the threshold voltage distribution of the memory cell is brought to the threshold voltage distribution DS2. Thus, each of the threshold voltage distributions DS1 and DS2 is used as the threshold voltage distribution of the memory cell in the "physical erase state". Since the read criterion voltage VR1 lies between the threshold voltage distributions DS1 and DS2, binary determination of data stored in the memory cell can be performed.

When the logical ease is conducted, the read criterion is simply set to the voltage VR2. The writing of data is performed after the logical erase. The threshold voltage of the memory cell with the data written therein is moved to the area of the threshold voltage distribution DS3. In this state, each of the areas of the threshold voltage distributions DS2 and DS1 are assumed to be an erase state, and the threshold voltage distribution DS3 is assumed to be a write state. The read criterion voltage VR2 exists between the threshold voltage distributions DS2 and DS3. Thus, the threshold voltage distributions DS1 and DS2 and the threshold voltage distribution DS3 can be discriminated by the read criterion voltage VR2 in the logical erase state. Accordingly, the stored data of the memory cell can be binary-determined.

The logical erase simply shifts a read criterion including a write verify voltage and does not perform the transfer of electrical charge accumulated in the floating gate of the memory cell. Thus, the application of an erase voltage to each memory cell becomes unnecessary and power consumption is reduced. Further, the time necessary for erasing is also taken only for voltage switching and a verify operation is not necessary. Thus, the logical erase is shorter than the physical erase.

Figure 6:
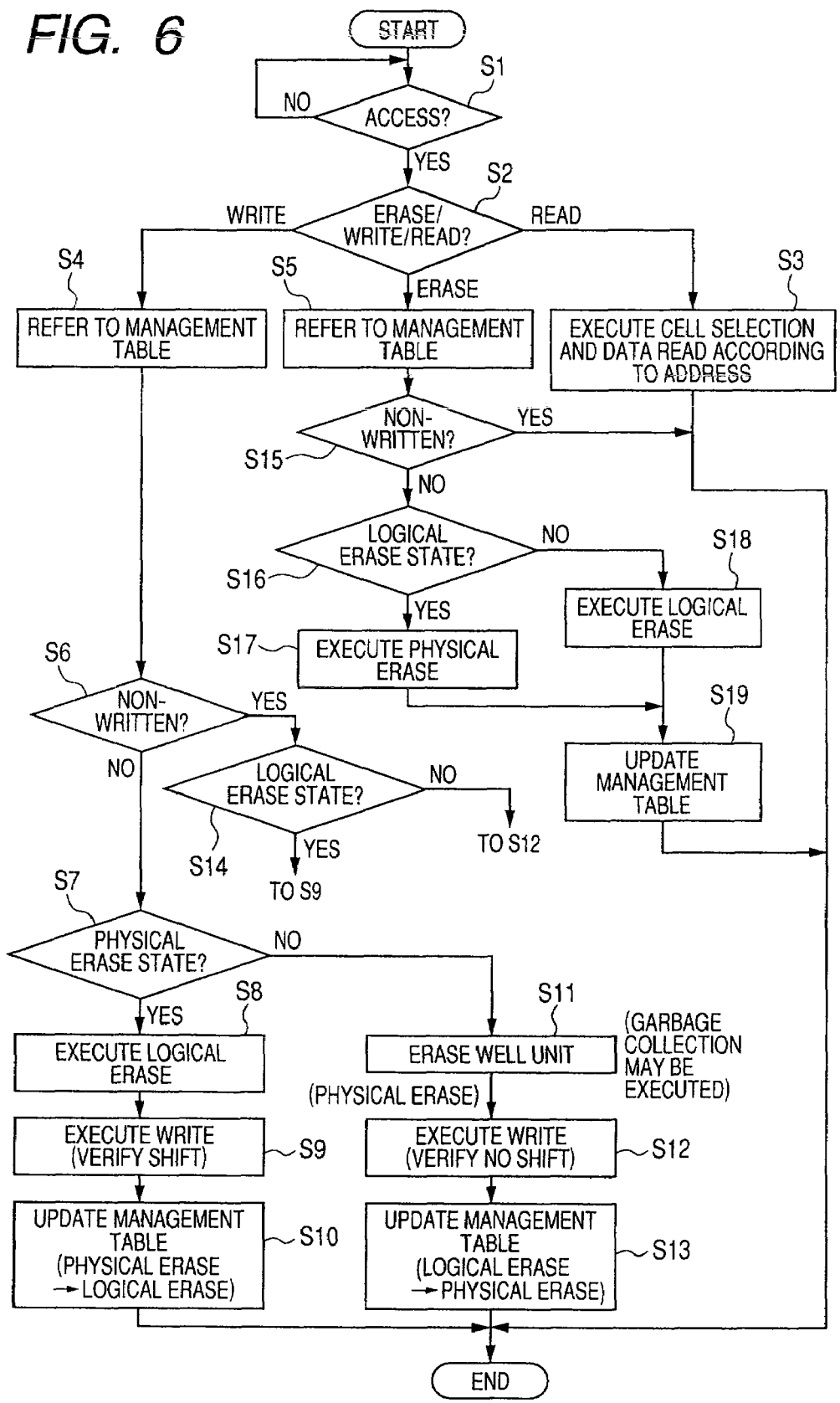
FIG. 6 is a flow chart depicting a data access operation of the non-volatile semiconductor memory device according to the first embodiment of the present invention.

FIG. 6 is a flow chart showing a data access operation of the non-volatile semiconductor memory device according to the first embodiment of the present invention. The operation of the non-volatile semiconductor memory device according to the first embodiment of the present invention will be explained below with reference to FIG. 6.

The control circuit 4 shown in FIG. 1 monitors a command CMD supplied from outside and determines whether an access request has been given (Step S1). The non-volatile semiconductor memory device is held in a standby state until the access request is supplied.

When the access request is given, the control circuit 4 shown in FIG. 1 determines whether the given command is of a read command for instructing the reading of data, a write command for instructing the writing of data or an erase command for instructing the erasure of stored data (Step S2). When the read command for instructing the data reading is given, the column selection circuit 5 and the word line selection drive circuits WD0 through WDk select addressed memory cells MC in accordance with the address signal AD and the write/read circuit 6 shown in FIG. 1 performs the reading of data (Step S3).

Figure 7:
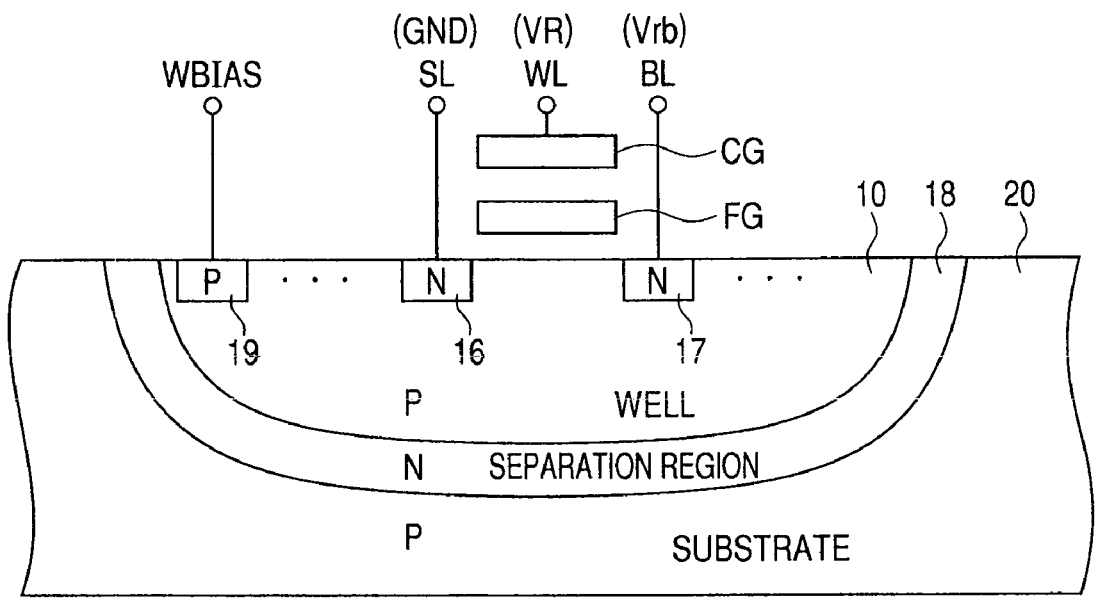
FIG. 7 is a diagram showing a sectional structure of a memory cell of the non-volatile semiconductor memory device according to the present invention and applied voltages at reading thereof.

Upon the data reading, such voltages as shown in FIG. 7 are applied to the selected memory cell. Here, a sectional structure of the memory cell is shown in FIG. 7 together. In FIG. 7, the memory cell MC includes N-type impurity regions 16 and 17 formed in a P well (P-type well) 10, and a floating gate FG and a control gate CG sequentially stacked over the surface of a well region between these impurity regions 16 and 17. A bias voltage WBIAS is applied to the P well 10 by a P-type impurity region 19 provided at the periphery of the P well 10.

The P well 10 is separated from a well (10) forming other blocks by an N separation region (N-type separation region) 18.

When the writing or erasing of data is executed during a previous cycle, selection information is set to a shift latch lying in a word line selection drive circuit to be described later according to the erase state as a word line read voltage VR transmitted to the corresponding word line. Thus, there is no need to refer to the erase management table upon the data reading.

A plurality of P wells 10 are respectively separated from one another by N separation regions 18 and arranged in the surface of a semiconductor substrate 20. Each of the wells 10 forms the unit of the physical erase corresponding to the first erase unit. A plurality of word lines are arranged in the wells 10.

Upon the data reading, a read voltage VR (VR1 or VR2) is applied to the corresponding word line as shown in FIG. 7. A bit line read voltage Vrb is applied to the corresponding bit line BL. A source line SL is set to a ground voltage GND. Each P well 10 is normally held at a predetermined voltage level corresponding to a ground voltage level. In this state, current selectively flows from the bit line BL to the source line SL according to whether the threshold voltage of the selected memory cell is in any of the areas for the threshold voltage distributions DS1 through DS3. A sense amplifier contained in the write/read circuit 6 shown in FIG. 1 detects the current flowing through the bit line BL to perform the reading of data.

When the command indicative of the erasing or writing of data is applied, the control circuit 4 refers to the erase management table 7 (Steps S4 and S5). When the write command indicative of data writing is given at this time, the control circuit 4 shown in FIG. 1 refers to the erase management table 7 (Step S4) and determines based on the write state flag whether the memory cell coupled to its corresponding word line designated by the address signal AD is in a write state (Step S6). When the addressed word line is in the write state, the control circuit 4 then determines whether the designated memory cell (word line) is in either the physical erase state or the logical erase state (Step S7).

When the memory cell for the addressed word line is in the physical erase state, the logical erase is executed on the addressed word line (Step S8). In this case, the word line read voltage VR corresponding to the read criterion given to the word line is simply changed from the voltage VR1 to the voltage VR2 (refer to FIG. 5). Thereafter, writing into the memory cell coupled to the addressed word line is executed in accordance with external write data (Step S9). There is a need to perform write verify upon this writing. Upon this verify, a verify voltage is also shifted similarly according to the shifting of the word line read voltage to perform verify.

Figure 8:
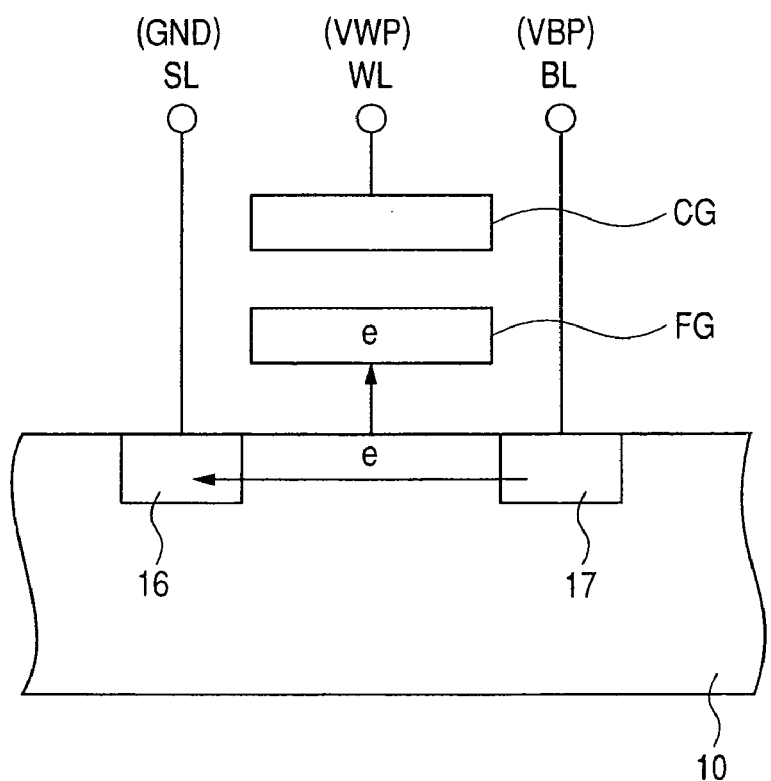
FIG. 8 is a diagram schematically illustrating applied voltages at writing of the memory cell of the non-volatile semiconductor memory device according to the present invention.

FIG. 8 is a diagram schematically showing voltages applied to each memory cell at the above data writing. In FIG. 8, a bit line write high voltage VBP is applied to the corresponding bit line BL in the memory cell intended for writing, and a word line write high voltage VWP is applied to the corresponding word line WL. A P well 10 and a source line SL are maintained at a ground voltage GND. Under this condition, current flows between impurity regions 17 and 16 as indicated by arrow in FIG. 8. At the current flowing through the memory cell, hot electrons are generated by a drain high electric field based on the high voltage VBP of the bit line BL. The hot electrons are accelerated toward a floating gate FG by the word line write high voltage VWP applied to the word line WL, so that the hot electrons are injected into the floating gate FG. Thus, the electrical charge (electrons) are accumulated in the floating gate FG so that the threshold voltage of the memory cell becomes high.

Figure 9:
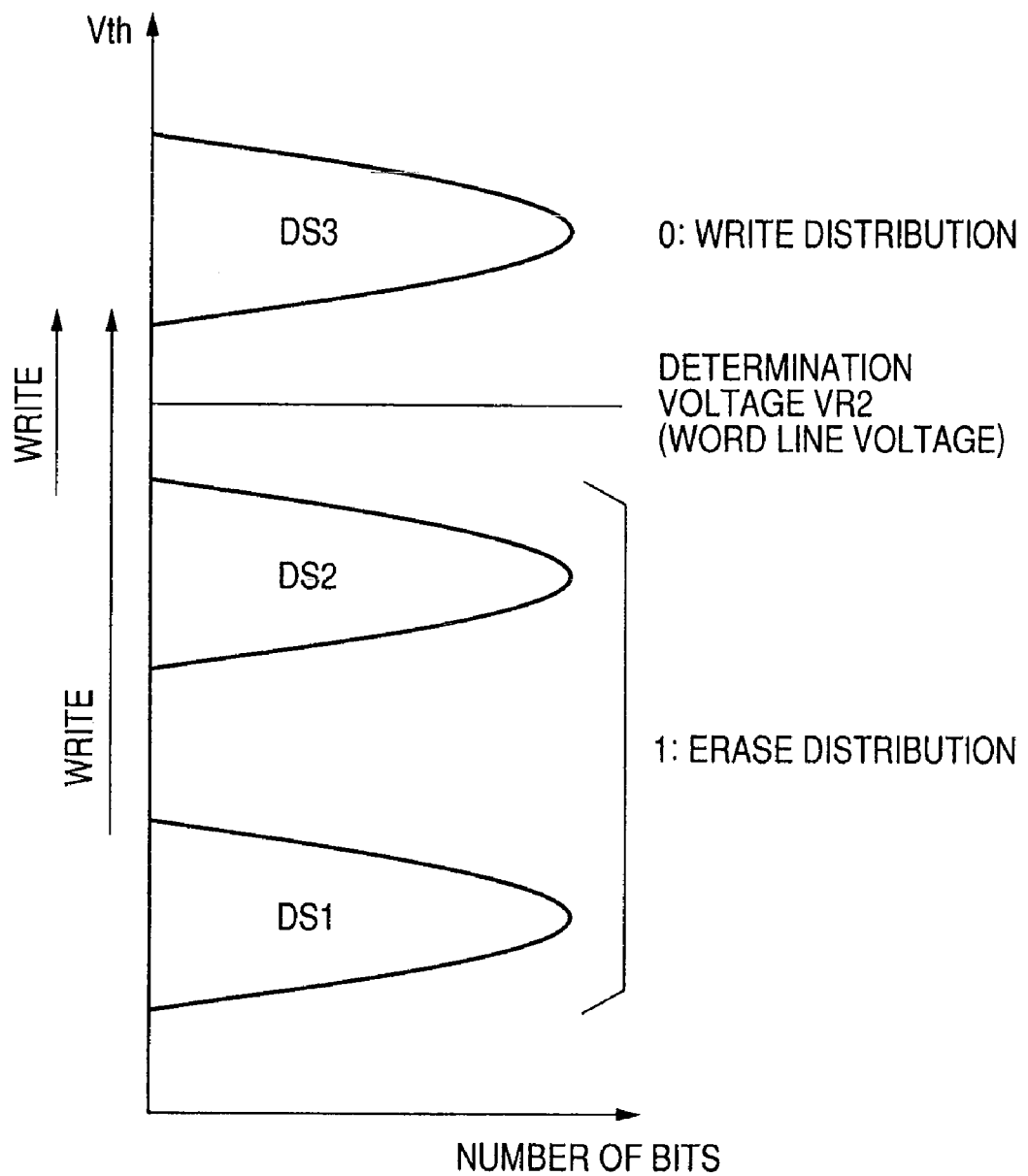
FIG. 9 is a diagram schematically depicting one example of a threshold voltage distribution at logical erasing in the first embodiment of the present invention.

FIG. 9 is a diagram schematically showing threshold voltage distributions after the logical erase and wiring. In a logical erase state, the threshold voltage distributions DS1 and DS2 are respectively associated with an erase state and associated with a state in which data "1" is stored. Upon writing, the threshold voltages of the memory cells for the threshold voltage distributions DS1 and DS2 rise and are transitioned to the threshold voltage distribution DS3. Each memory cell having a threshold voltage higher than the word line read voltage VR2 corresponding to the criterion at data reading is brought to the write state and associated with a state in which data "0" is stored.

Upon execution of the logical erase, the level of the word line read voltage is simply shifted and electrons are not pulled out from the corresponding floating gate FG in practice. It is therefore possible to shorten the time necessary for erasing. There is no need to apply a high voltage at erasure, and stress of an insulating film (insulating film lying below floating gate FG) of each memory cell can be lightened.

Upon pre-writing erasing, the level of the word line read voltage is simply changed and power consumption at erasing is reduced. Upon writing, verify is conducted. Since the threshold voltage distribution DS3 is newly utilized in this case, it is determined whether the threshold voltage of each memory cell that stores data "0" intended for writing exits within an area defined by lower and upper limit values of the threshold voltage distribution DS3. This write/verify operation is repeated until the threshold voltage of the memory cell with the data "0" written therein falls within the threshold voltage distribution DS3.

After the writing at Step S9, the erase management table 7 is updated. Namely, the erase state flag of the addressed word line is changed from the physical erase state to the logical erase state. The write flag is held in a write state.

On the other hand, when it is determined at Step S7 shown in FIG. 6 that the addressed memory cell is not in the physical erase state, i.e., it is in the logical erase state, erase based on a well unit is executed (Step S11). In this case, erasing is executed on all the memory cells coupled to each word line contained in the well 10. Thus, a "garbage collection" that required data that need not to be erased are temporarily saved and the saved data are rewritten after erasing thereof may be executed. It is possible to perform rewriting of data in word line units even after the well unit-based erase.

Figure 10:
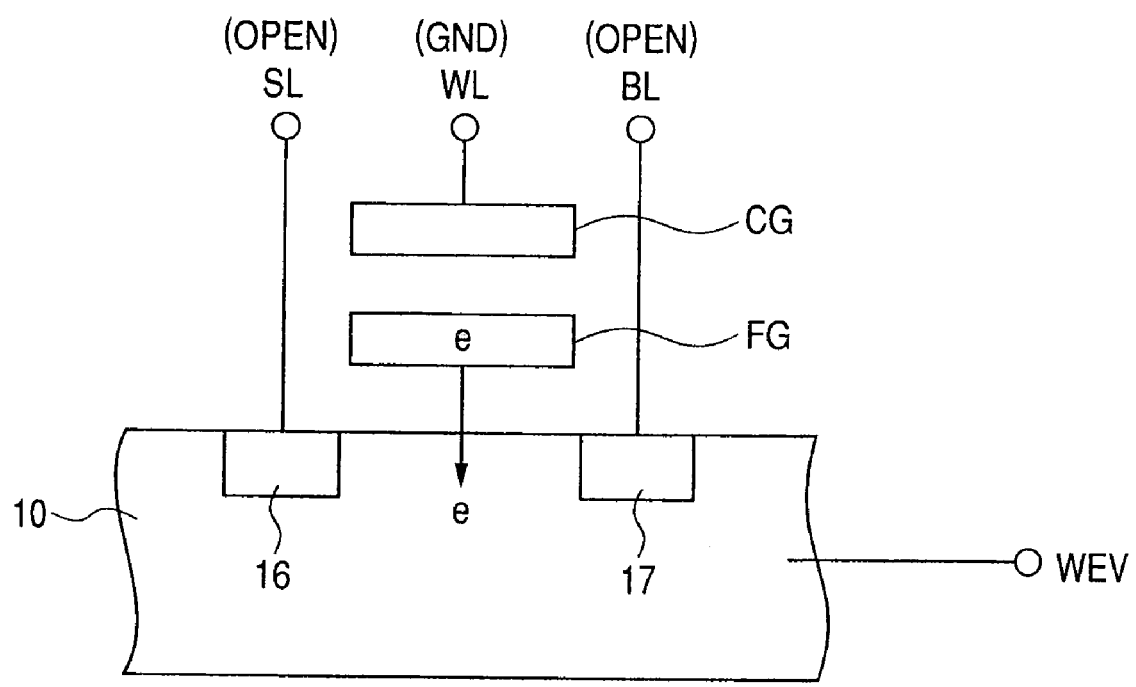
FIG. 10 is a diagram schematically showing applied voltages at physical erasing of the memory cell of the present invention.

FIG. 10 is a diagram schematically showing voltages applied to each memory cell at erasing based on the well unit. Upon this erase, a well erase high voltage WEV is applied to the corresponding well 10 and the corresponding word line WL is maintained at a ground voltage GND level. A bit line BL and a source line SL are respectively set to a floating state (open state). The well erase high voltage WEV applied to the well 10 is of a positive voltage. Accordingly, the high voltage is applied between a control gate CG and the well 10, so that an electrical charge (electrons) accumulated in a floating gate FG is discharged to the well 10, thereby reducing the threshold voltage of a memory cell transistor.

Figure 11:
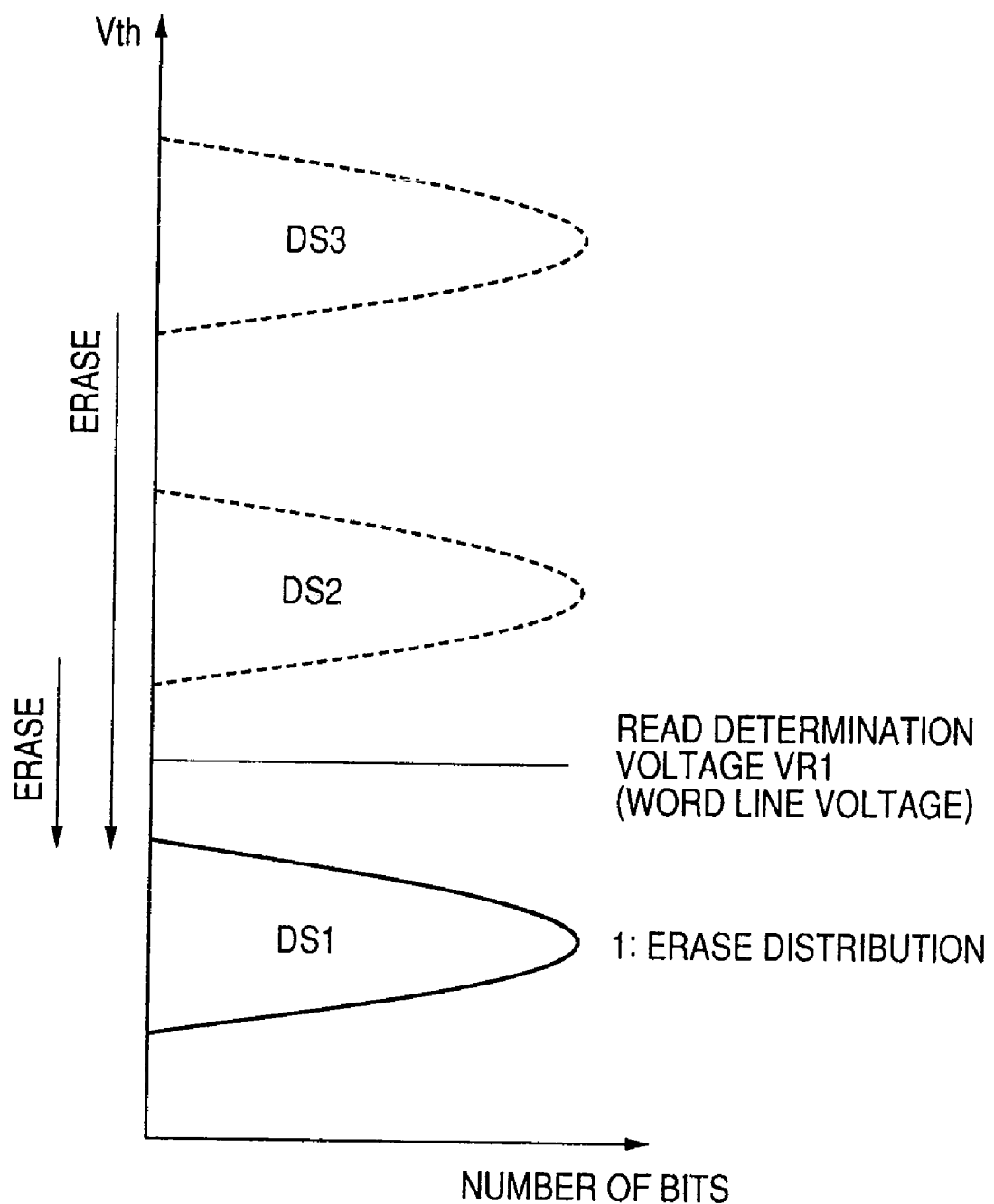
FIG. 11 is a diagram schematically illustrating one example of a threshold voltage distribution at physical erasing of the memory cell.

Upon erasing in the well unit, an erase verify operation is executed so that such a threshold voltage distribution DS1 as shown in FIG. 11 is obtained. That is, the threshold voltage of each memory cell exists in the distributions DS1 through DS3 respectively in the logical erase state. With the erasing in the well unit, the threshold voltage of each memory cell lying in the well 10 is distributed within an area for the threshold voltage distribution DS1. This state corresponds to a state in which the threshold voltage of the memory cell is lower than a read criterion (i.e., word line read voltage) VR1.

Next, the writing of data into the memory cell held in the physical erase state is executed (Step S12). The applied voltage at this writing is the same as the write voltage shown in the previous FIG. 8. In this case, the threshold voltage distribution DS2 is utilized as a threshold voltage distribution for a write state. Thus, write verify is executed using upper and lower limit values of the threshold voltage distribution DS2 as verify voltages at a write verify operation.

Figure 12:
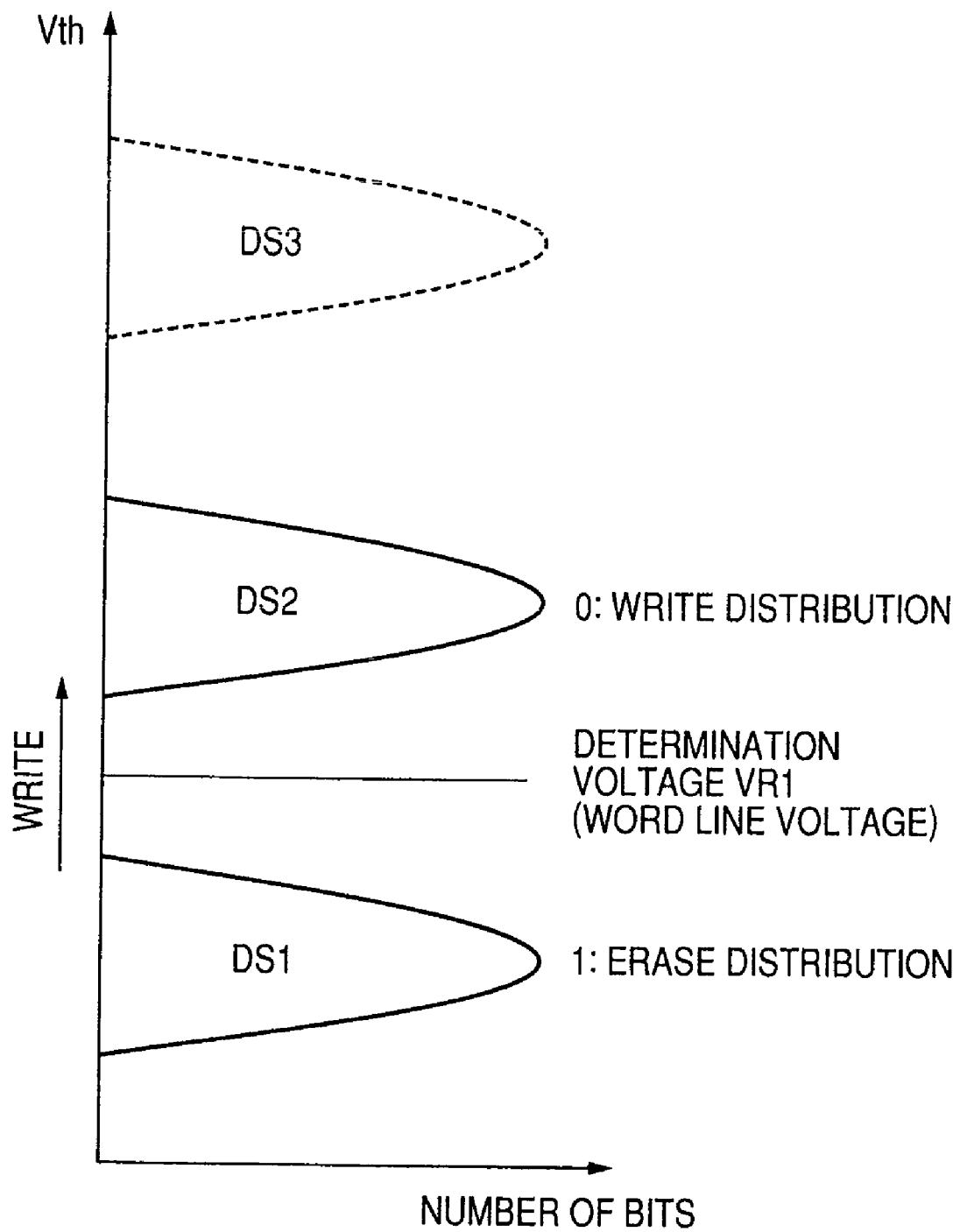
FIG. 12 is a diagram schematically showing a threshold voltage distribution at writing after the physical erasing of the memory cell.

With this writing, such threshold voltage distributions as shown in FIG. 12 are obtained. That is, the write state corresponds to the threshold voltage distribution DS2 and the erase state corresponds to the threshold voltage distribution DS1. The threshold voltage distribution DS3 is not utilized in this case.

Thereafter, the control circuit 4 obtains access to the erase management table 7 to update erase state flags of all word lines lying within corresponding well regions from the logical erase state to the physical erase state. In this case, the write flag relative to each word line on which writing has been executed is set to the write state, and the write flag relative to each word line other than the word lines on which writing has been executed, at the word lines subjected to the erase is set to a non-write state.

Supplying the voltage VR1 to the corresponding memory cell in the physical erase state as the word line read voltage makes it possible to discriminate the threshold voltage distributions DS1 and DS2 and execute determination of "1" and "0" with respect to data in the memory cell.

When it is determined at Step S6 that the addressed word line is in the non-write state, the ease state of the addressed word line is then determined referring to the erase state flag (Step S14). When the addressed word line is in the logical erase state, the above operation proceeds to Step S9 where post-logical erase writing is executed. When the addressed word line is not in the logical erase state but in the physical erase state, the above operation proceeds to Step S12 where post-physical erase writing is executed. After these write operations, the erase state flag is maintained and the write state flag is set to the write state.

On the other hand, when the erasure of the stored data is designated at Step S2, it is first determined by reference to the write state flag of the erase management table 7 (Step S5) whether the corresponding word line is in a non-write state (Step S15). When the corresponding word line is in the non-write state, the erasing becomes unnecessary and is completed.

On the other hand, when the corresponding word line is in the write state, it is determined by reference to the erase state flag of the corresponding word line whether the corresponding word line is in the logical erase state (Step S16). When the corresponding word line is in the logical erase state, erasing in the well unit, i.e., the physical erase is conducted for erasing of the stored data (Step S17). On the other hand, when the corresponding word line is in the physical erase state, the addressed word line is set to the logical erase state (Step S18). These erase operations are similar to the erase operations executed at Steps S8 and S11, and their details will not be repeated.

After these erase operations, the erase management table 7 is updated (Step S19). Upon updating of the erase management table 7, the erase state flag is set to a value indicative of the executed erase state and the write flag is set to the non-write state.

In a flash memory, the erase unit is normally set in advance. An address indicative of an erase area is given along with an erase command upon erasing. The erasure of each designated area may be executed in accordance with the erase area instruction address. Thus, the erase unit may be set to either the word line unit or the well unit upon the logical erase.

With the execution of the logical erase, the number of times that the physical erase is executed is reduced, and a reduction in the reliability of each memory cell is suppressed.

In a flash memory built-in microcomputer, a flash memory is used to store a control program for the microcomputer. A program written in accordance with the operation referred to above is used for control of microcomputer products. Thus, the rewriting of the contents of the flash memory is normally considered to little occur. There is, however, a case in which the program needs to be modified due to a pre-shipment program revision, post-shipment function addition, etc. In this case, there is a need to erase and write the stored control program. When the size of the program is a small size of a few Kbytes or so, the erasing and rewriting of the contents of the flash memory can be performed according to the program size by rewriting in word line units.

Figure 13:
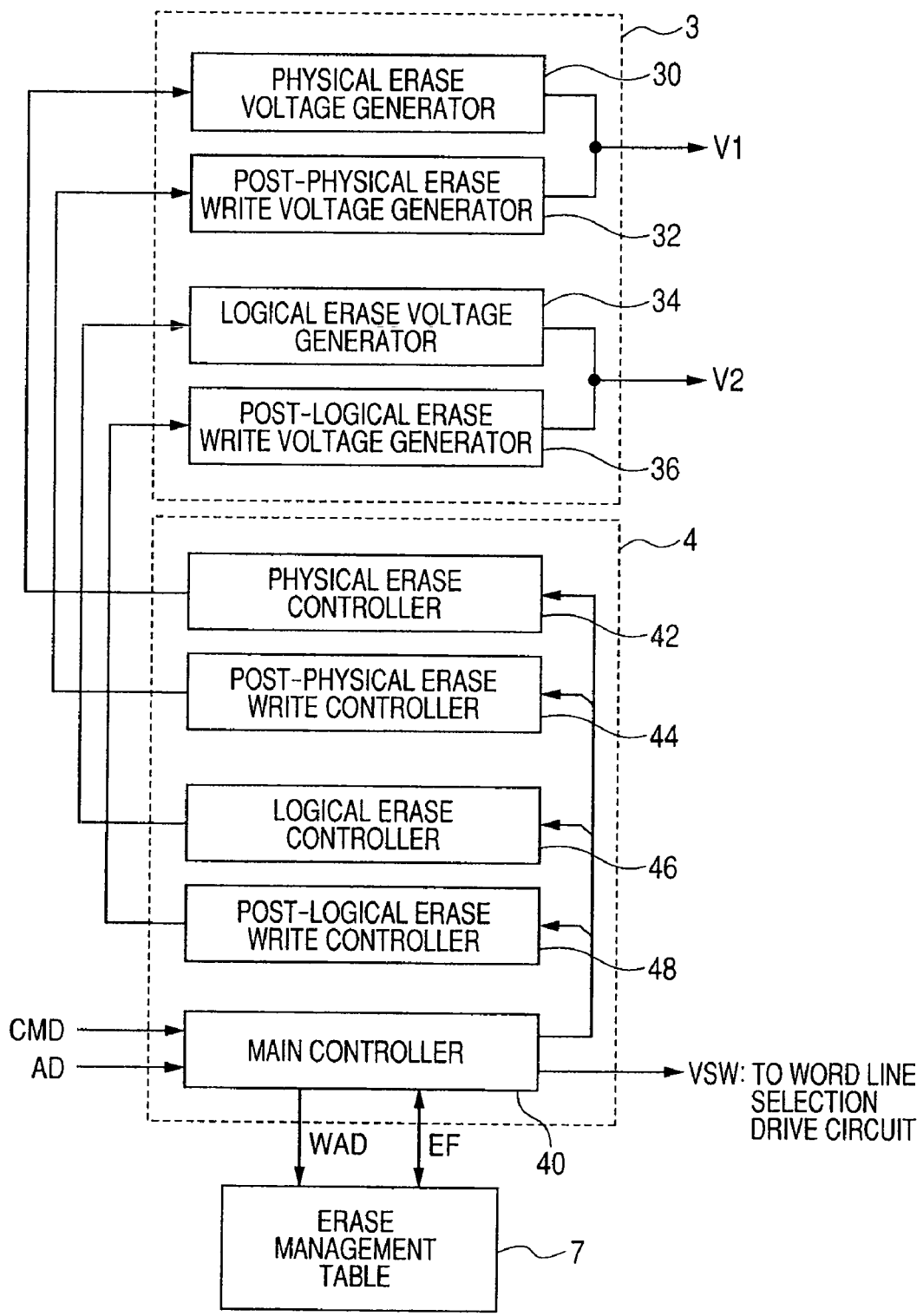
FIG. 13 is a diagram schematically depicting one example illustrative of configurations of an internal voltage generating circuit and a control circuit shown in FIG. 1.

FIG. 13 is a diagram schematically showing configurations of the internal voltage generating circuit 3 and the control circuit 4 of the non-volatile semiconductor memory device according to the first embodiment of the present invention. In FIG. 13, the internal voltage generating circuit 3 includes a physical erase voltage generator 30 for generating a voltage for performing an erasure physically, a post-physical erase write voltage generator 32 for generating a voltage necessary to perform writing after the physical erase, a logical erase voltage generator 34 for generating a voltage necessary for a logical erase, and a post-logical erase write voltage generator 36 for generating a voltage used for writing after the logical erase. The voltage outputted from each of the physical erase voltage generator 30 and the post-physical erase write voltage generator 32 is supplied to its corresponding word line selection drive circuit as a voltage V1. The voltage outputted from each of the logical erase voltage generator 34 and the post-logical erase write voltage generator 36 is supplied to its corresponding word line selection drive circuit as a voltage V2.

A configuration similar to an internal voltage generator used in a multivalued memory storing data more than or equal to a ternary value therein can be utilized as the internal voltage generating circuit 3. While the physical erase voltage generator 30, the post-physical erase write voltage generator 32, the logical erase voltage generator 34 and the post-logical erase write voltage generator 36 are respectively shown so as to be provided individually in the internal voltage generating circuit 3 in FIG. 3, they are simply different in terms of voltage levels generated. A charge pump circuit or the like for generating a high voltage can be shared therefor. The required voltage of level is generated by an operation such as level shifting.

The physical erase voltage generator 30 generates voltages necessary to realize the threshold voltage distribution DS1 shown in FIG. 11, i.e., an erase high voltage and an erase verify voltage. The post-physical erase write voltage generator 32 generates voltages for realizing the threshold voltage distribution DS2 shown in FIG. 11, i.e., a write high voltage and a write verify voltage. The logical erase voltage generator 34 simply generates a read criterion applied to the corresponding word line upon data reading, i.e., a voltage VR2 as a word line read voltage. The post-logical erase write voltage generator 36 generates voltages (write high voltage and write verify voltage) necessary to realize the threshold voltage distribution DS3 shown in FIG. 11.

The control circuit 4 comprises, for example, a sequence controller and activates internal control signals in a predetermined sequence in accordance with an external command CMD. In FIG. 13, the configuration of the control circuit 4 is shown in divided form every function to definitely represent the control form of the control circuit 4.

In FIG. 13, the control circuit 4 includes a main controller 40 which performs various control in accordance with a command CMD indicative of an operation mode and an address signal, and a physical erase controller 42, a post-physical erase write controller 44, a logical erase controller 46 and a post-logical erase write controller 48 which execute designated operations under the control of the main controller 40. When the command CMD is of a write command for instructing the writing of data, the main controller 40 refers to the erase management table 7 based on a word line address WAD contained in the address signal AD to read a flag EF indicative of an erase state (erase state of each memory cell coupled to the word line) of the corresponding word line. The main controller 40 determines in accordance with the read erase state flag EF whether either a physical erase or a logical erase should be done. In accordance with the result of determination, the main controller 40 supplies a voltage switching signal VSW to the corresponding word line selection drive circuit (WD).

When the erase state flag EF is indicative of a logical erase state, the physical erase controller 42 is activated by the main controller 40 to control the execution of an operation necessary for the physical erase and activates the physical erase voltage generator 30 to generate each voltage necessary for the physical erase as a voltage V1. The voltages necessary for the physical erase are of a positive high voltage applied to each well and a voltage (high-side source voltage) used in each word line selection drive circuit. The physical erase controller 42 executes control on a verify operation at erasing and a verify decision.

When the physical erase controller 42 is activated by the main controller 40 and the physical erase is completed through the verify operation or the like for the physical erase, the post-physical erase write controller 44 is made active. The post-physical erase write controller 44 activates the post-physical erase write voltage generator 32 upon operation to generate voltages necessary for writing after the physical erase. In this case, each of voltages or the like applied to the word and bit lines upon writing and verify is generated as the voltage V1. The post-physical erase write controller 44 also executes the verify operation (verify determination) at writing.

When the main controller 40 determines that the erase state flag EF is indicative of the physical erase state, the logical erase controller 46 is activated by the main controller 40 and supplies a word line read voltage VR2 transmitted to the corresponding word line as a voltage V2. The post-logical erase write controller 48 is activated after execution of the logical erase by the control of the logical erase controller 46 to generate each voltage necessary for writing. Even in this case, each of voltages or the like supplied to the corresponding word and bit lines upon writing and verify is generated as a voltage V2.

The post-physical erase write voltage generator 32 and the post-logical erase write voltage generator 36 may generate write voltages identical in voltage level upon writing. Since, however, the threshold voltage distributions of each memory cell are different upon the verify, there is a need to generate verify voltages different in level. The configuration of the non-volatile semiconductor memory device that stores multivalued data therein can be utilized as the configurations of these voltage generators and controller.

Figure 14:
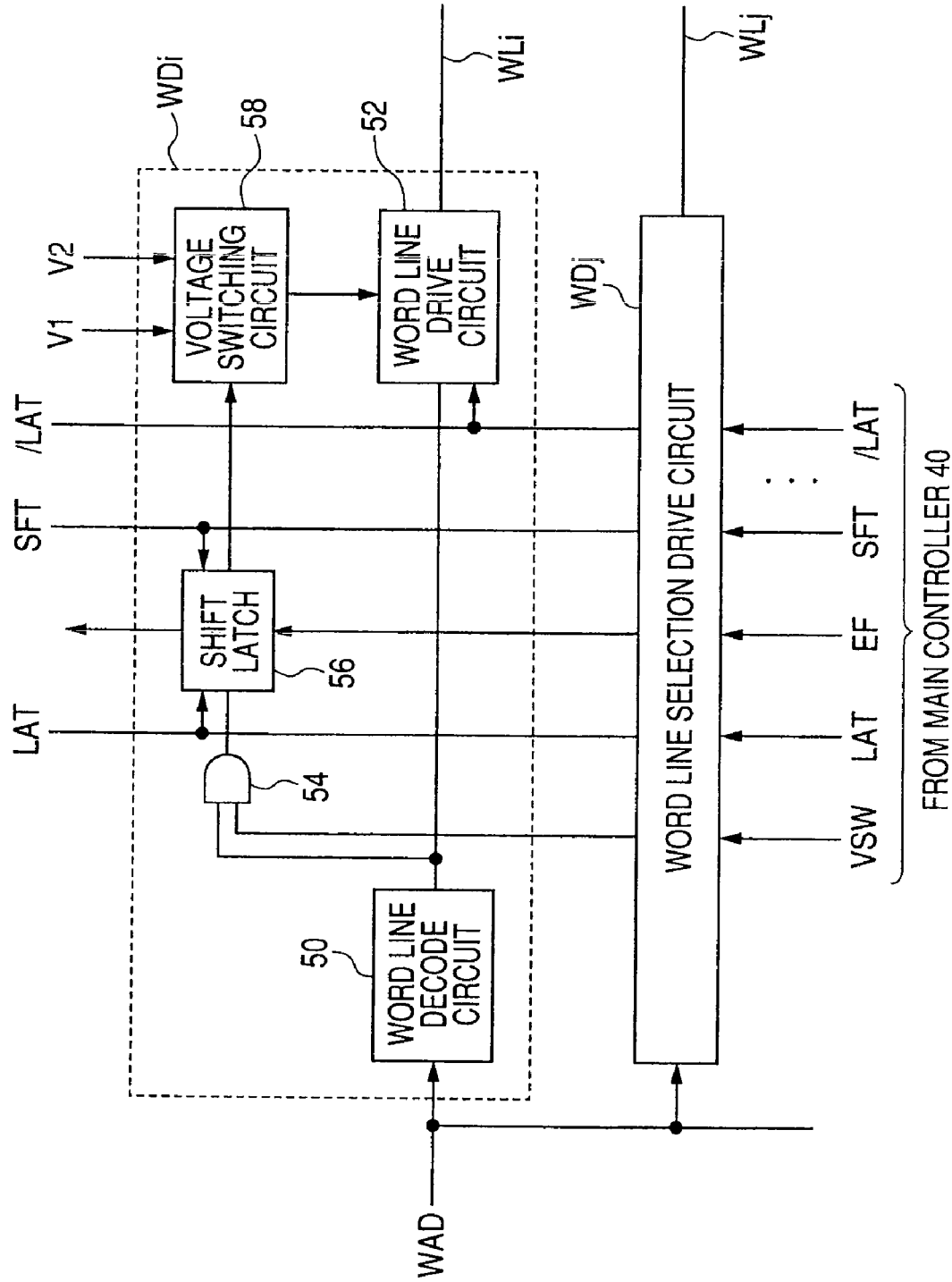
FIG. 14 is a diagram schematically depicting one example of a configuration of a word line selection drive circuit shown in FIG. 1.

FIG. 14 is a diagram schematically showing one example illustrative of configurations of the word line selection drive circuits WD0 through WDk shown in FIG. 1. Since these word line selection drive circuits WD0 through WDk have the same configuration respectively, a concrete configuration of the word line selection drive circuit WDi is shown and the word line selection drive circuit WDj is shown in block in FIG. 14. The word line selection drive circuits each equal in configuration to the word line selection drive circuit WDi are provided corresponding to respective word lines.

The word line selection drive circuit WDi includes a word line decoder circuit 50 for decoding a word line address signal WAD and a word line drive circuit 52 for driving the corresponding word line WLi in accordance with a decode signal outputted from the word line decode circuit 50. The word line decode circuit 50 is activated in predetermined timing under the control of the main controller 40 shown in FIG. 13 to decode the word line address signal WAD, thereby generating a word line designation signal. The word line drive circuit 52 supplies a voltage corresponding to an operation mode to the corresponding word line WLi upon selection in accordance with the decode signal (word line designation signal) outputted from the word line decode circuit 50.

The word line selection drive circuit WDi further includes a gate circuit 54 which receives the voltage switching signal VSW outputted from the main controller 40 shown in FIG. 13 and the word line designation signal outputted from the word line decode circuit 50, a shift latch 56 which latches an output signal of the gate circuit 54 in accordance with a latch designation signal LAT, and a voltage switching circuit 58 which selects one of the voltages V1 and V2 in accordance with latch data of the shift latch 56 and supplies it to the word line drive circuit 52.

The voltage switching signal VSW is "0" upon the physical erase state and "1" upon the logical erase state by way of example. The shift latch 56 latches the output signal of the gate circuit 54 upon activation of the latch designation signal LAT. Thus, when the word line designated by the word line address signal WAD is designated or specified, the output signal of the word line decode circuit 50 becomes "1", so that the gate circuit 54 operates as a buffer and outputs a signal corresponding to an erase state flag.

The shift latch 56 latches the output signal of the gate circuit 54 upon activation of the latch designation signal LAT. The shift latch 56 sequentially shift-in/shift-out erase flags EF (EF1, EF2, EF3, . . . , EFk) serially read from the erase management table in accordance with a shift clock signal SFT and latches the same therein. Namely, upon an initializing operation after power-on or system reset, the shift latch 56 stores erase state flags stored in the erase management table therein according to a shift operation. Even though the stored data are erased upon power shutdown, the shift latch 56 is capable of reliably storing the erase state flag corresponding to the state of each corresponding word line upon the initialization. As the shift latch 56, there can be used a scan register that configures a boundary scan path standardized as a test standard.

A complementary latch designation signal /LAT is supplied to the word line drive circuit 52. Upon the latch operation of the shift latch 56, the word line drive circuit 52 is maintained in an inactive state. Thus, even though the word line decode circuit 50 performs a decode operation upon the latch operation of the shift latch 56, the corresponding word line WLi is maintained in a non-selected state.

The voltage switching circuit 58 selects one of the voltages V1 and V2 in accordance with the data latched in the shift latch 56. A voltage outputted from the voltage switching circuit 58 is utilized as an operating source voltage for the word line drive circuit 52.

The word line selection drive circuit WDj has a configuration similar to that of the word line selection drive circuit WDi. As described above, the flag indicative of an erase state of each word line is stored in the shift latch 56 in accordance with each of the erase flags of the management table upon the initialization. Upon processing execution, an update process is executed as mentioned below to update the erase state of each word line. That is, a voltage switching signal VSW is generated in common to the word line selection drive circuits WD0 through WDk set in the physical erase units in accordance with the erase state flags EF. The voltage switching signal VSW is stored in the shift latch 56 in accordance with the output signal of the word line decode circuit 50. Thus, even if the erase state of each word line is updated upon the processing execution, the flags indicative of the erase states in the word line units are stored and the voltage corresponding to each erase state can be supplied to the word line drive circuit 52.

Incidentally, when there is an areal allowance, a dedicated decode circuit for selecting a voltage switching signal corresponding to an erase state flag is provided aside from the word line decode circuit 50. A word line address decode signal outputted from another dedicated decode circuit may be supplied to the gate circuit 54 together with the voltage switching signal VSW to update the corresponding erase flag stored in the shift latch 56.

The voltage switching signal VSW, latch designation signal LAT, complementary latch designation signal/LAT and shift clock signal SFT are supplied from the main controller 40 shown in FIG. 13. Upon latching of shift data in the shift latch 56, the word line drive circuit 52 is maintained in the inactive state by the latch designation signal/LAT, so that the corresponding word line (WLi) is maintained in the non-selected state. Thus, even if the word line decode circuit 50 is operated upon updating of the latch data of the shift latch 56 at erase state determination/setting, the corresponding word line is reliably prevented from being erroneously driven to a selected state.

Figure 15:
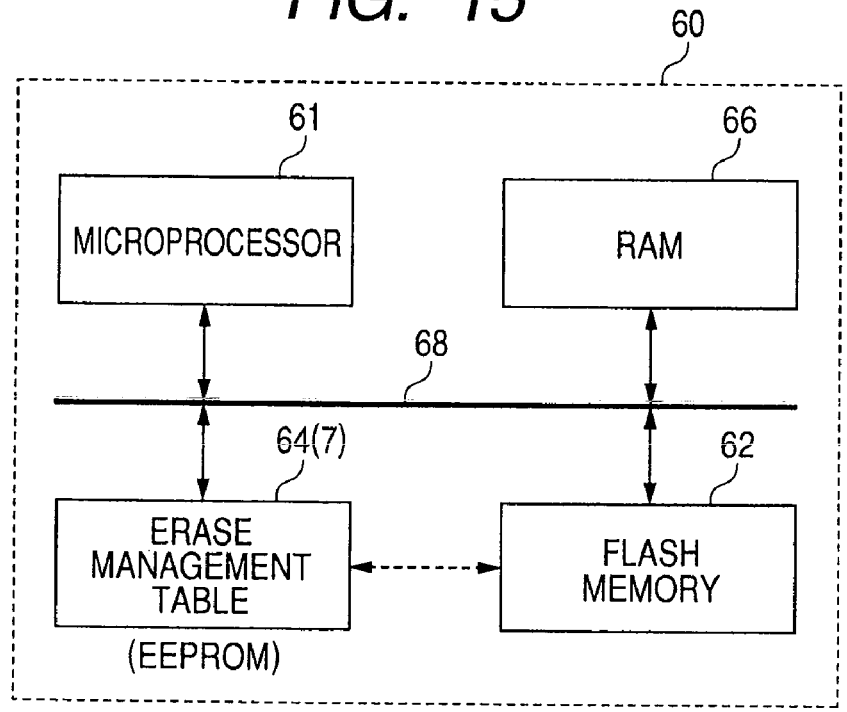
FIG. 15 is a diagram schematically showing a chip configuration of a microcomputer in which a flash memory (non-volatile semiconductor memory device) according to the first embodiment of the present invention is built.

FIG. 15 is a diagram showing one example of a layout of the erase management table 7 in the first embodiment of the present invention. In FIG. 15, a flash memory 62 is provided within a flash memory built-in microcomputer 60. The flash memory built-in microcomputer 60 is integrated over one semiconductor chip and includes a microprocessor 61, a RAM (random access memory) 66, the flash memory 62 and the erase management table 64 (7). These microcomputer 60, erase management table 64, RAM 66 and flash memory 61 are intercoupled to one another by an internal data bus 68. The RAM 66 is utilized as a working area of the microprocessor 61. A control program executed by the microprocessor 60 is stored in the flash memory 62. The erase management table 64 (7) is comprised of, for example, an EEPROM (electrically erasable programmable ROM) outside the block of the flash memory 62.

The main controller (40) lying in the flash memory 62 obtains access to the erase management table 64 via the internal data bus 68 or another control bus indicated by a broken line to execute reading and updating of each erase state flag. When the erase management table 64 is configured by the EEPROM, an EEPROM cell is comprised of a serial body of a selection transistor and a storage transistor. The EEPROM cell is capable of updating each erase state flag in one-bit units and updating the erase state flag for every word line.

Incidentally, even when the erase state flags are stored every word line, the erase state flags about plural word lines (all word lines for blocks or memory areas, for example) can be stored with respect to one word line of the EEPROM by dividing the word line address (WAD) into row and column addresses of the EEPROM that configures the erase management table 64 (7). Thus, even when the erase state is managed in the word line unit, large memory capacity is not so required as the memory capacity of the EEPROM.

The EEPROM is larger than the flash memory in the allowable number of rewritings. When the control program of the microprocessor 61 is stored in the flash memory 62, the number of times that the control program is reprogrammed or rewritten is low and the rewriting and holding of each erase state flag can be performed sufficiently and stably.

Incidentally, the control circuit lying in the flash memory 62 obtains access to the erase management table 64 and executes reading/updating of the erase state flag in the configuration shown in FIG. 15. However, the microprocessor 61 may execute access to the erase management table 64 upon data rewriting and supply write data and an address signal to the flash memory 62 via the internal bus 68 together with the corresponding erase state flag of the erase management table.

Figure 16:
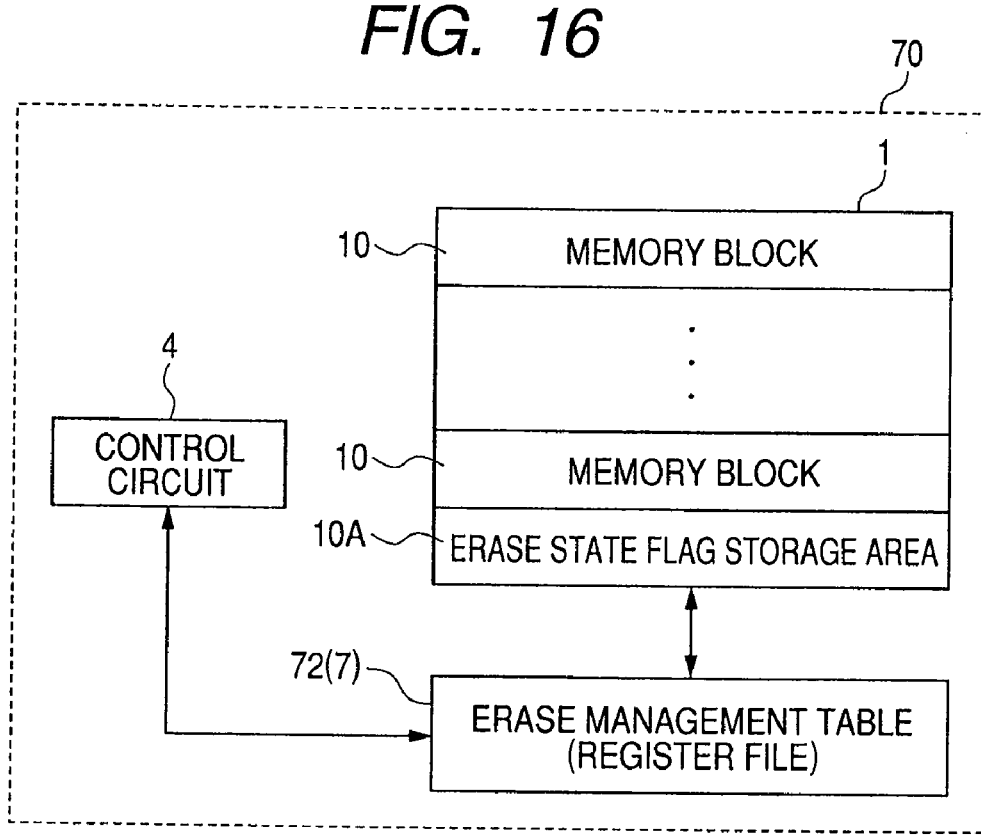
FIG. 16 is a diagram schematically illustrating another layout of an erase management table according to the first embodiment of the present invention.

FIG. 16 is a diagram schematically showing one example of another configuration of the erase management table. In FIG. 16, an erase management table 72 (7) is provided within a flash memory 70. The erase management table 72 is comprised of, for example, a register file such as an SRAM (static random access memory). A memory cell array 1 is divided into memory blocks every well 10. One memory block (well region) 10A in the memory cell array 1 is used as an erase state flag storage area. Upon power-on or rising after system resetting, the memory block 10A transfers the corresponding erase state flag stored therein to the erase management table 72 and stores the erase state flag in each word line unit. The control circuit 4 obtains access to the erase management table 72 upon data writing and thereby read and updates the corresponding erase state flag.

The erase management table 72 is comprised of a register file. Upon access to the flash memory 70, its stored data can be easily updated. At power shutdown, each erase state flag stored in the erase management table 72 is saved into the erase state flag storage area 10A. Thus, upon rewriting of the erase state flag, a high voltage for writing becomes unnecessary and power consumption can be reduced. Even where the erase management table 72 is comprised of the register file, the number of word line addresses is a few K, the memory capacity thereof is small and an increase in the area of the flash memory 70 is suppressed.

Incidentally, the flash memory built-in microcomputer is integrated onto one semiconductor chip. Thus, the erase management table 72 may be arranged as a macro outside the flash memory (macro) where the erase management table is comprised of the register file.

[Modification]

Figure 17:
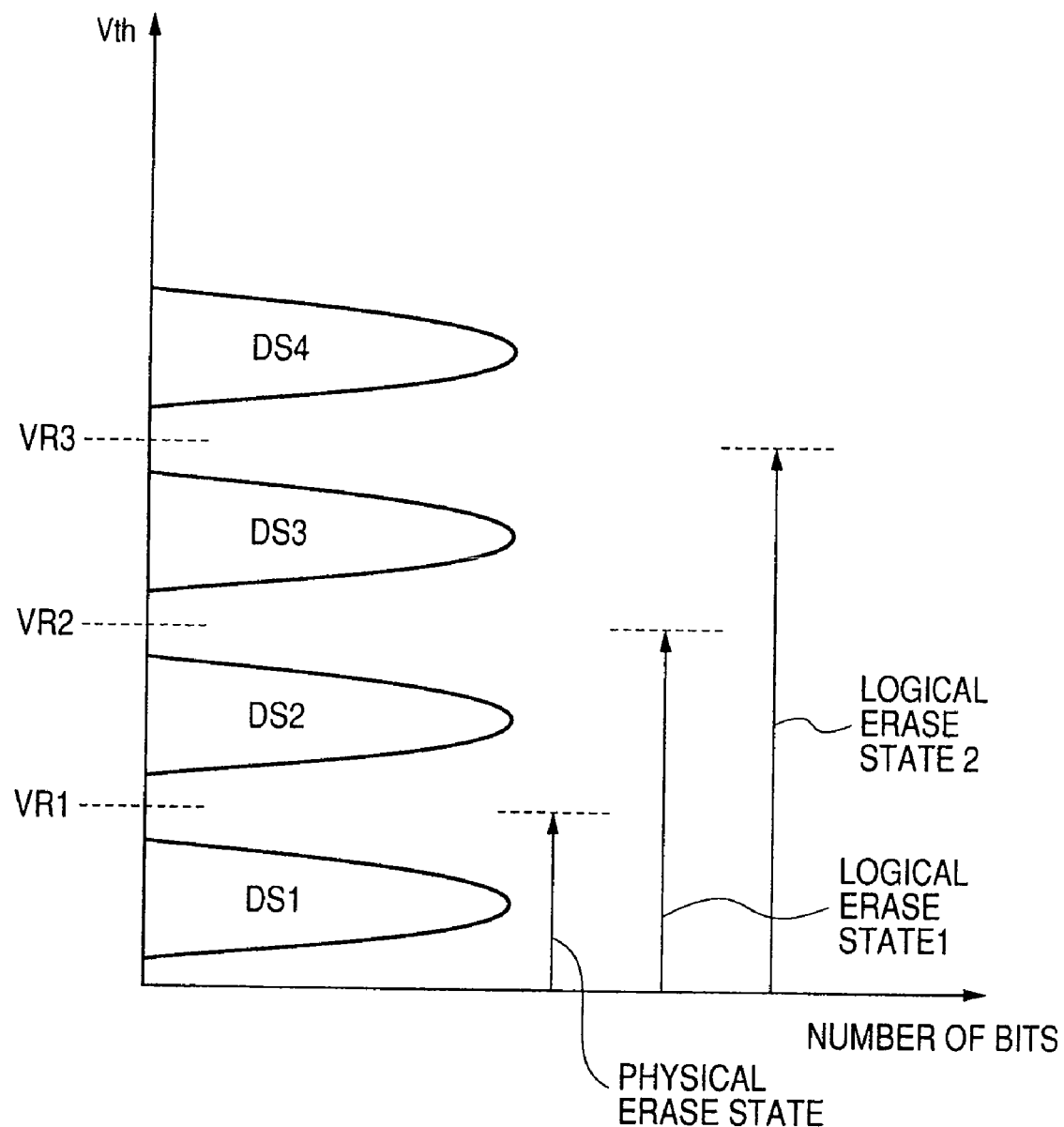
FIG. 17 is a diagram schematically showing a threshold voltage distribution of a memory cell according to a modification of the first embodiment of the present invention.

FIG. 17 is a diagram schematically showing threshold voltage distributions of a memory cell according to a modification of the first embodiment of the present invention. In FIG. 17, the memory cell is capable of storing quaternary data therein and having a threshold voltage existing in an area of any of the threshold voltage distributions DS1 through DS4 according to the stored data. In this case, any of voltages VR1, VR2 and VR3 can be supplied as a word line read voltage. Upon a physical erase state, the word line read voltage VR1 is transmitted. When the word line read voltage VR2 is used as a read criterion, the state of the memory cell is set as a logical erase state 1. Namely, in this state, the threshold voltage distributions DS1 and DS2 are respectively determined as an erase state and the threshold voltage distribution DS3 is determined as a write state. When the word line read voltage VR3 is used as the read criterion, the state of the memory cell is set as a logical erase state 2, the threshold voltage distributions DS1 through DS3 are respectively determined as an erase state, and the threshold voltage distribution DS4 is determined as a write state.

Thus, when the quaternary data can be stored, the two types of logical erase states can be used as the logical erase states. Upon rewriting to the memory cell with respect to the logical erase state 2, the corresponding physical erase is executed.

Generally, when the memory cell can store N-value data therein, (N−2) logical erase states can be prepared as the logical erase states. Thus, in the first embodiment, the operation of performing logical threshold voltage determination at plural stages is executed as identification as to whether the logical erase state is taken. Upon rewriting of the maximum read criterion voltage with respect to the corresponding word line in the logical erase state, the physical erase is executed.

Figure 18:
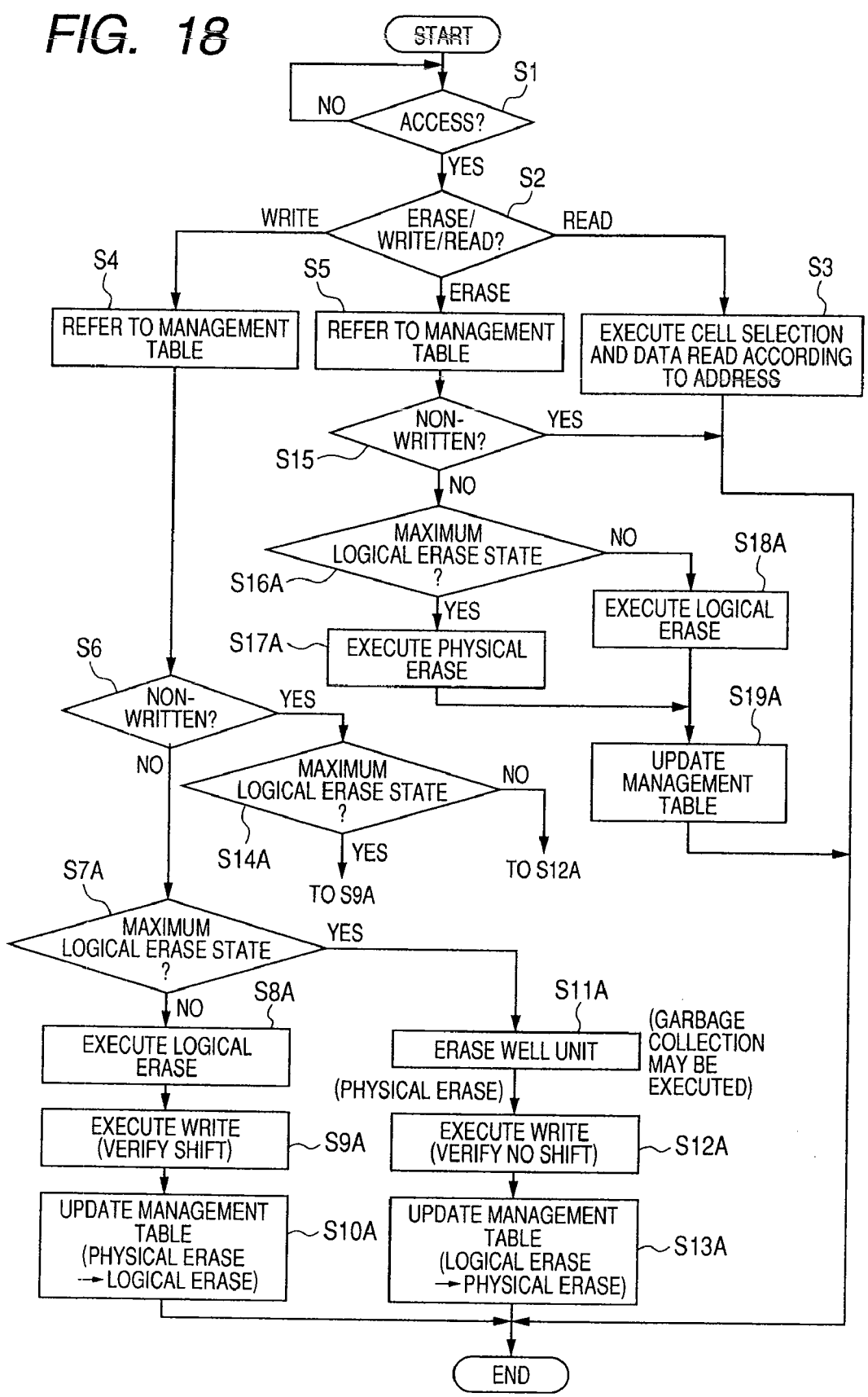
FIG. 18 is a flow chart showing a data access operation of the modification of the first embodiment of the present invention.

FIG. 18 is a flow chart showing a data access operation of the modification of the first embodiment of the present invention. The operation of the modification of the first embodiment of the present invention will hereinafter be described with reference to FIG. 18.

In the rewriting operation flow chart shown in FIG. 18, the write determining operation from Steps S1 through S6 in the flow chart shown in FIG. 6 and the erase determining operation from Steps S2, S5 and S15 are identical. Upon data reading, the voltage corresponding to the erase state by the voltage switching circuit has already been selected. In a manner similar to the flow chart shown in FIG. 6, reference to the erase management table is not required in particular upon the data reading.

A write or erase operation is designated and reference to the erase management table is performed at Step S4 or S5. Processing subsequent to Step S6 and S15 at which determination as to whether the designated area or region is in a non-write state has been done is different from the flow shown in FIG. 6. Namely, when it is determined at Step S6 that the area is non-written, it is determined by reference to each erase state flag of the management table whether the selected word line is in the maximum logical erase state, i.e., the logical erase state 2 (Step S7A). Since there is an allowance for making a further one-stage shift of the logical erase state where the selected word line is not in the maximum logical erase state, the logical erase is executed (Step S8A). Namely, the level of the word line read voltage is shifted up by one stage. The threshold voltage distributions DS1 through DS3 shown in FIG. 7 are respectively set to the erase state.

Next, the writing of data and the verify operation are executed according to the shifted read determination voltage. A verify voltage at the verify operation is shifted up similarly according to the shift of the determination voltage (Step S9A). The threshold voltage of each memory cell in the write state exists in the area for the threshold voltage distribution DS4.

Next, the value of the erase state about the corresponding word line in the management table is updated after the completion of writing. Namely, the corresponding word line is set to the logical erase state 1 in the case of the physical erase state. In the case of the logical erase state 1, the corresponding word line is set to the logical erase state 2 by incrementing the value indicative of the logical erase state by 1.

On the other hand, when it is determined at Step S7A that the word line corresponding to the maximum logical erase state exists, erasing in a well unit is executed (Step S11A). In this case, a garbage collection may be executed in a manner similar to the flow chart shown in the previous FIG. 6.

Next, the writing of data to the corresponding word line is executed according to write data (Step S12A). After the completion of this writing, the management table is updated so that its erase state value is set to a value indicative of a physical erase state of an initial value from the maximum logical erase state value (value indicative of the logical erase state 2).

On the other hand, when it is determined at Step S15 that writing has been made, determination as to whether the corresponding area is in the maximum logical erase state (Step S16A). When it is determined that the corresponding area is in the maximum logical erase state, the physical erase is executed (Step S17A). When it is determined that the corresponding area is not in the maximum logical erase state, the logical erase is conducted (Step S18A). After these, the management table is updated and the write state flag is set to a non-write state. Further, each erase state is set to its corresponding value that designates the erase state. Namely, when the physical erase is executed at Step S17A, the corresponding erase state flag is set to a value indicative of a physical erase state. When the logical erase is executed at Step S18A, the value of the logical erase state is updated by 1.

Thus, the values from 0 to N−2 are assigned to the logical erase state sequentially from the physical erase state as the erase states, thereby making it possible to execute the physical erase and the logical erase corresponding to a flash memory cell capable of storing N-value data therein.

Incidentally, the configurations shown in the previous FIGS. 13 and 14 may be expanded corresponding to the respective logical erase states as the configurations of the respective circuits.

According to the first embodiment of the present invention as described above, the erase units (first and second erase units) that are two in size are provided as the erase units. Thus, each well needs not to be divided finely in order to realize small erase units. An increase in chip area is suppressed and small erase units can be realized. Upon erasing in small erase units, the level of the word line voltage at reading is simply shifted. The time necessary for erasing can be shortened and power consumption can be reduced. It is further possible to suppress the degradation of the reliability of each memory cell.

In the case of the flash memory built in the microcomputer, the logical erase operation that the word line read voltage is simply changed can be realized with respect to a program revision immediately before the shipment and post-shipment function addition. Therefore, it can adapt to a demand for shortening of a rewriting time.

Second Embodiment

Figure 19:
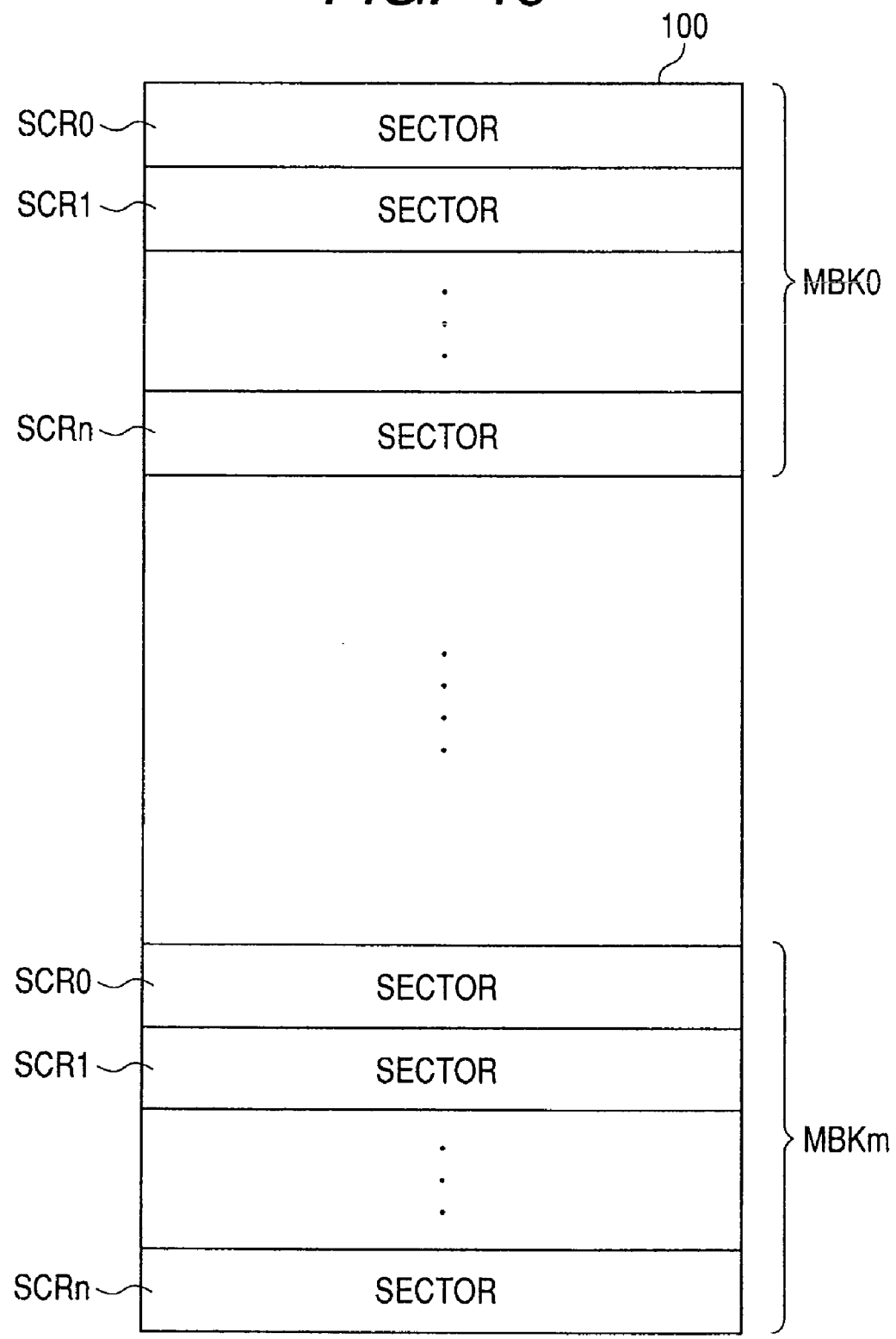
FIG. 19 is a diagram schematically depicting a configuration of a memory cell array of a non-volatile semiconductor memory device according to a second embodiment of the present invention.

FIG. 19 is a diagram schematically showing a configuration of a memory cell array of a non-volatile semiconductor memory device according to a second embodiment of the present invention. In FIG. 19, the memory cell array 100 is divided into a plurality of memory blocks MBK0 through MBKm. Each of the memory blocks MBK0 through MBKm includes a plurality of sectors SCR0 through SCRn. Erase units are executed in memory block units and write units are sector units. A plurality of word lines are arranged in each of the sectors SCR0 through SCRn. Each of memory cells is of a flash memory cell comprised of a stack-type transistor having a floating gate in a manner similar to the first embodiment.

Figure 20:
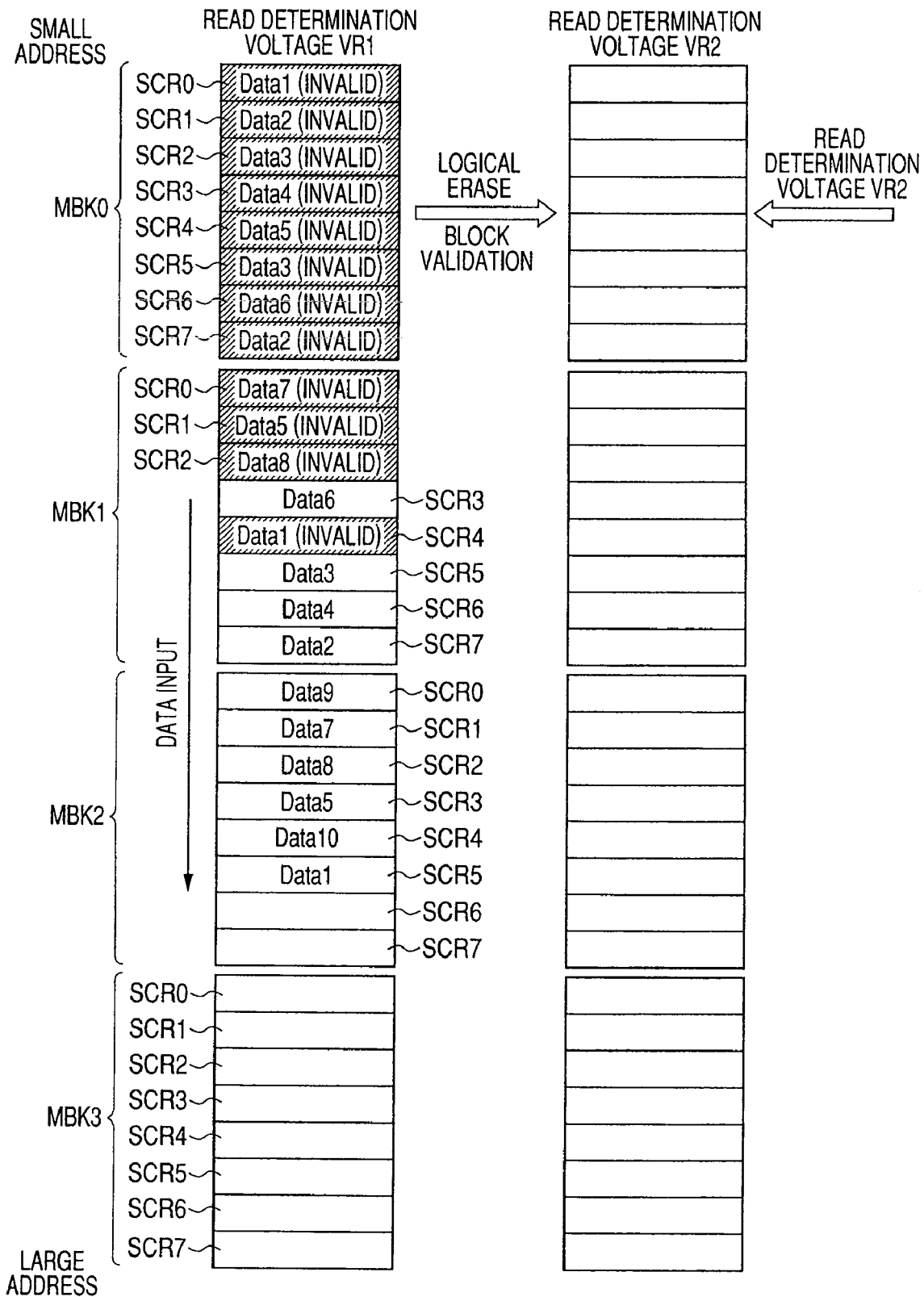
FIG. 20 is a diagram schematically illustrating a data write sequence of the non-volatile semiconductor memory device according to the second embodiment of the present invention.
Figure 21:
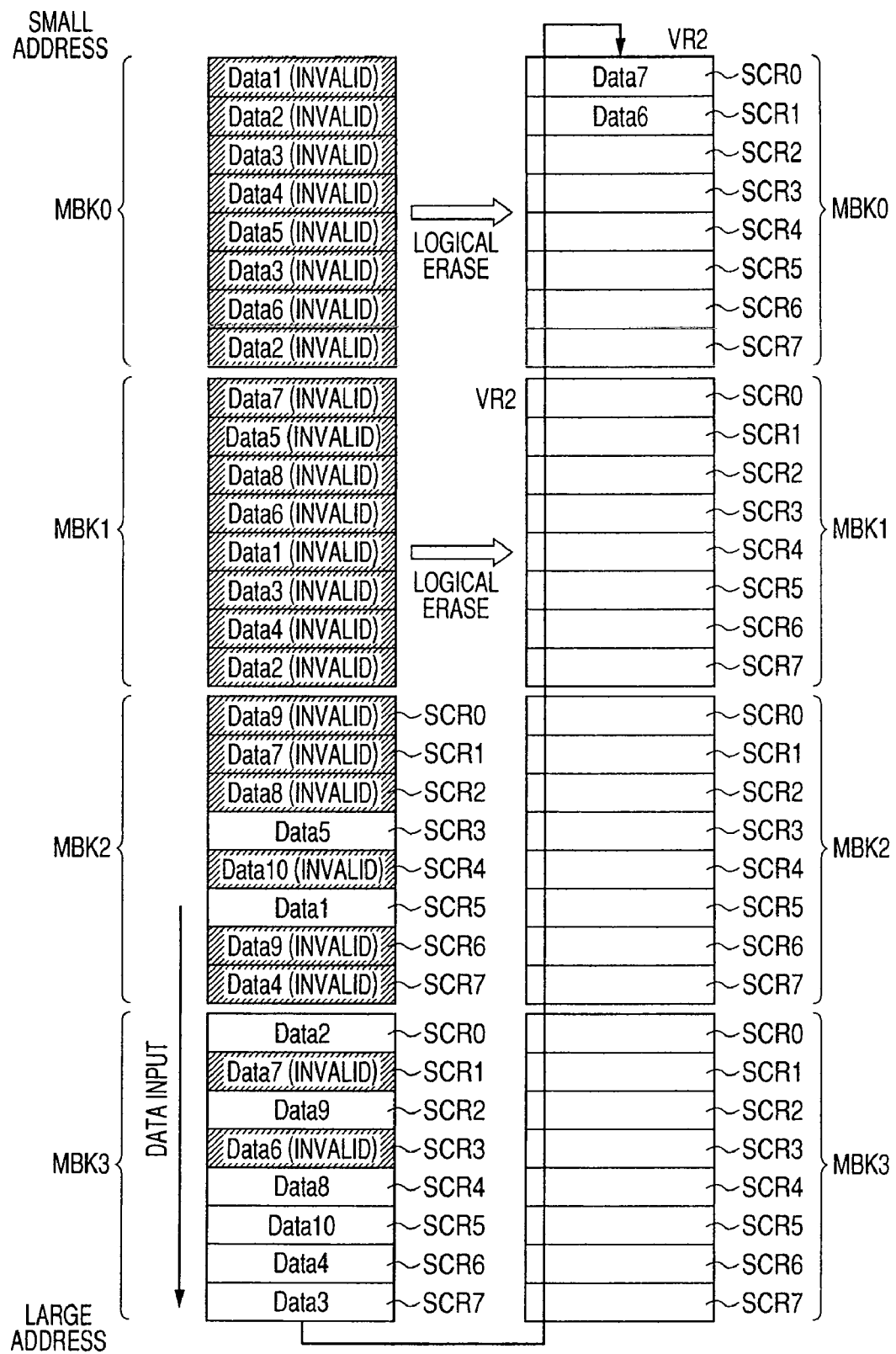
FIG. 21 is a diagram schematically showing a data write sequence of the non-volatile semiconductor memory device according to the second embodiment of the present invention.

FIGS. 20 and 21 are respectively diagrams conceptually showing rewriting sequences of the non-volatile semiconductor memory device according to the second embodiment of the present invention. A configuration in which the memory blocks MBK0 through MBK3 are provided is shown as one example in each of FIGS. 20 and 21. Each of the memory blocks MBK0 through MBK3 includes eight sectors SCR0 through SCR7. By way of example, the memory blocks MBK0 through MBK3 respectively have a memory capacity of 2K bytes and the sectors SCR0 through SC7 respectively have a memory capacity of 256 bytes. Thus, a memory area of 8K bytes is realized by the memory blocks MBK0 through MBK3.

The rewriting sequences of the non-volatile semiconductor memory device according to the second embodiment of the present invention will be schematically explained below with reference to FIGS. 20 and 21.

Upon data writing, data writing is first sequentially executed from the sector SCR0 corresponding to a minimum sector address in the memory block MBK0. When the rewriting of data is performed on the same sectors in this case, the original sectors are made invalid and data writing is executed on each new sector. For example, data Data1 is first written into the sector SCR0 of the memory block MBK0. Data Data2 through Data5 are sequentially written into the sectors SCR1 through SCR4.

When the rewriting of the data Data3 stored in the sector SCR2 of the memory block MBK0 is performed, the sector SCR2 is set to an invalid state and data Data3 is written into a new sector SCR5. When the rewriting of data is conducted in like manner below, each sector area in which pre-rewriting data is stored is set to the invalid state and the writing of data to the sector corresponding to the minimum address, of the non-written sectors is executed. In this case, each area in which the original data is stored, is simply set to the invalid state upon rewriting of data, and the writing of data to another new sector is simply conducted. Thus, since no erase is done, the writing of data can be performed at high speed. It is possible to avoid the concentration of erasing on one sector and suppress degradation of the characteristic of each memory cell.

When the sectors SCR0 through SCR7 contained in one memory block (MBK0) are all brought to the invalid state, a logical erase is performed on the memory block MBK0, and the sectors SCR0 through SCR7 contained in this memory block MBK0 are all set to a valid state. Thus, the sectors SCR0 through SCR7 contained in the memory block MBK0 are supplied with a read determination voltage VR2 upon data reading.

As shown in FIG. 21, the operation of executing the rewriting of data for the sectors sequentially, setting the original sectors to the invalid state and writing data into new sectors is repeatedly executed. When the writing of data to the final sector SCR7 in the memory block MBK3 is completed, the sectors SCR0 through SCR7 of the memory block MBK0 are all in the valid state upon writing of the following new data Data7. Therefore, the writing of data is sequentially executed on the sectors SCR0 through SCR7 held in a logical erase state. Accordingly, the number of times that a physical erase for each memory block is conducted, can be reduced, and a reduction in the reliability of each memory cell can be suppressed. The level of a word line read voltage is simply updated upon changing from the physical erase state to the logical erase state, and the time for erasure can be greatly shortened.

FIG. 22 is a diagram schematically showing one example of a configuration of a block/sector management table 110 that manages the statuses of blocks/sectors and address translation employed in the non-volatile semiconductor memory device according to the second embodiment of the present invention. In FIG. 22, the block/sector management table 110 includes an address translation unit 110A and a block/sector status management unit 110B.

The address translation unit 110A includes a logical address storage area 111 and a physical address storage area 112. Each logical address is of an address given from a processor lying outside a flash memory. Each physical address is of an address indicative of each sector lying in the flash memory.

The logical addresses given from the processor are stored in the logical address storage area 111. The sector's physical addresses are stored in the physical address storage area 112 in association with the logical addresses. Upon rewriting, physical addresses for new rewriting destinations and logical addresses given at that time are associated with one another. Namely, upon rewriting, the given logical addresses and the physical addresses for the rewriting destinations are associated with one another and respectively stored in the logical address storage area 111 and the physical address storage area 112.

The block/sector status management unit 110B includes an erase state flag storage area 113 which stores erase state flags EF therein, a sector status flag storage area 114 which stores sector status flags SVF therein, and a block status flag storage area 115 which stores block status flags BVF therein. The block/sector status management unit 110B manages or controls statuses of the respective sectors every memory block. In these areas 113 through 115, the physical addresses are fixedly assigned to the respective areas in the order of the sector's physical addresses, and the erase and write states or the like of the respective sectors are managed by their corresponding flags.

Each of the erase state flags EF indicates whether the erase state of each corresponding sector is in either the logical erase state or the physical erase state. Each sector status flag SVF indicates whether the corresponding sector is in the valid state (non-written state), the write state and the invalid state.

The block status flag BVF indicates whether all sectors of the corresponding block are in the invalid state in each memory block unit or at least one sector is in the valid state, and indicates whether a state in which a logical erase has been performed or a state in which a physical erase has been performed is done as an erasure. When the block status flag BVF is set to the invalid state, all sectors in the corresponding memory block are respectively set to the invalid state. Therefore, the logical erase or the physical erase is executed according to the erase state of the corresponding sector, i.e., the presence or absence of execution of the logical erase. Address translation and data write/erase for the non-volatile semiconductor memory device are executed upon external access by referring to the block/sector management table 110.

Figure 23:
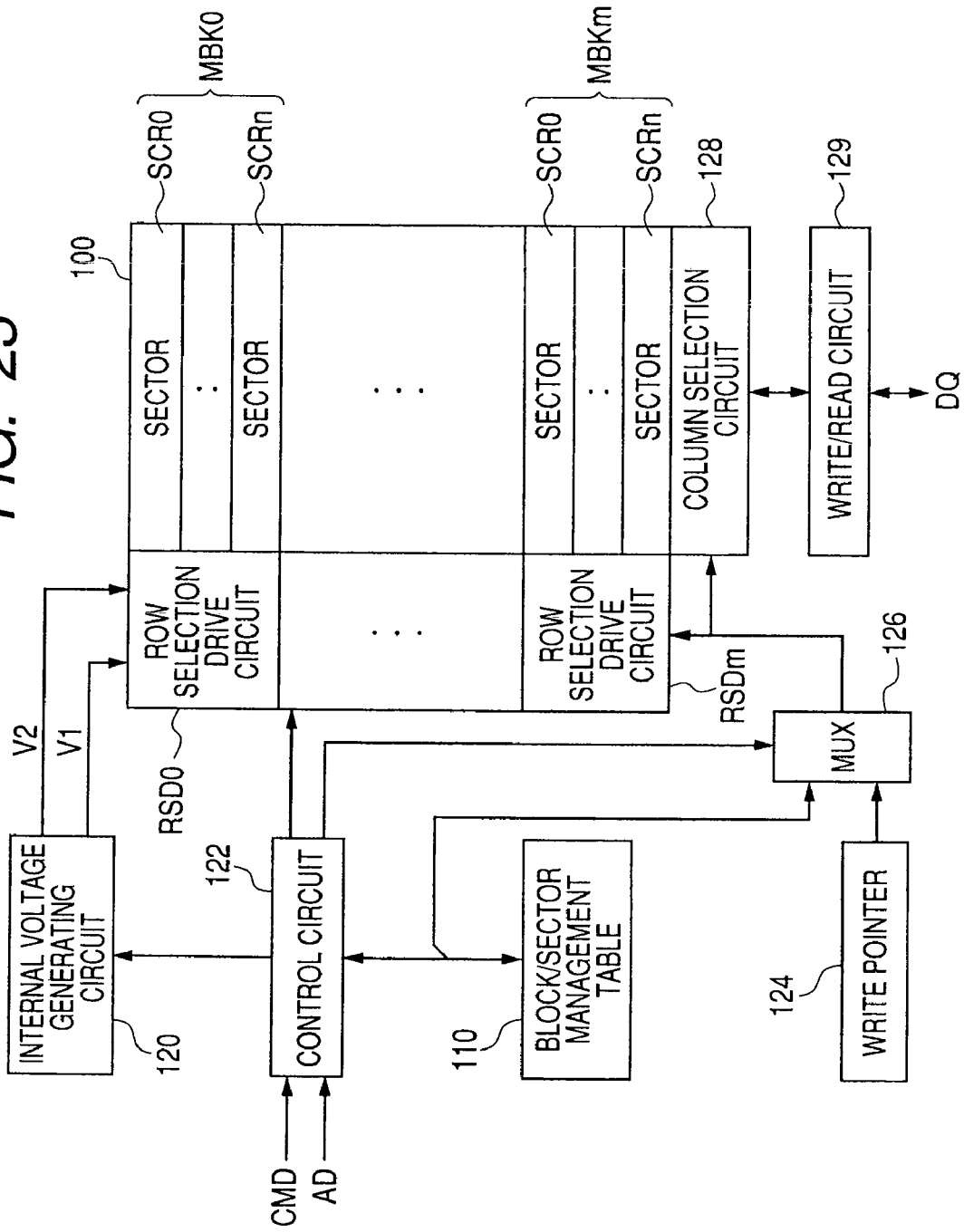
FIG. 23 is a diagram schematically showing an overall configuration of the non-volatile semiconductor memory device according to the second embodiment of the present invention.

FIG. 23 is a diagram schematically showing an overall configuration of the non-volatile semiconductor memory device according to the second embodiment of the present invention. In FIG. 23, the memory cell array 100 is divided into a plurality of memory blocks MBK0 through MBKm. Each of the memory blocks MBK0 through MBKm includes a plurality of sectors SCR0 through SCRn.

Row selection drive circuits RSD0 through RSDm are respectively provided in association with the memory blocks MBK0 through MBKm. These row selection drive circuits RSD0 through RSDm are respectively supplied with internal voltages V1 and V2 from an internal voltage generating circuit 120. One of the internal voltages V1 and V2 is selected under the control of a control circuit 122 and supplied to the row selection drive circuits RSD0 through RSDn in each memory block unit.

The control circuit 122 refers to the block/sector management table 110 in response to an external command CMD and an address signal AD and controls in accordance with the result of reference thereof, the generated voltage level of the internal voltage generating circuit 120, the writing and/reading of data and the forms of voltage selection at the row selection drive circuits RSD through RSDm.

A write pointer 124 and a multiplexer (MUX) 126 are provided to perform the writing of data into each non-written sector being in a valid state. The write pointer 124 increments its pointer value by 1 for every data rewriting and updates each sector address sequentially. The multiplexer 126 selects one of a physical address read from the block/sector management table 110 and a write sector pointer outputted from the write pointer 124 under the control of the control circuit 122 and supplies it to the row selection drive circuits RSD0 through RSDn and column selection circuit 128.

The column selection circuit 128 executes the operation of selecting a column in accordance with a sector address given from the multiplexer 126 and a column address signal contained in the address signal AD and couples the selected column to its corresponding write/read circuit 129. The write/read circuit 129 includes a register circuit provided corresponding to each bit line for latching write data therein upon data writing. Further, the write/read circuit 129 includes a preamplifier (sense amplifier) for detecting bit line current flowing through the selected column upon data reading, and an input/output buffer for performing the transfer of data to and from the outside.

Figure 24:
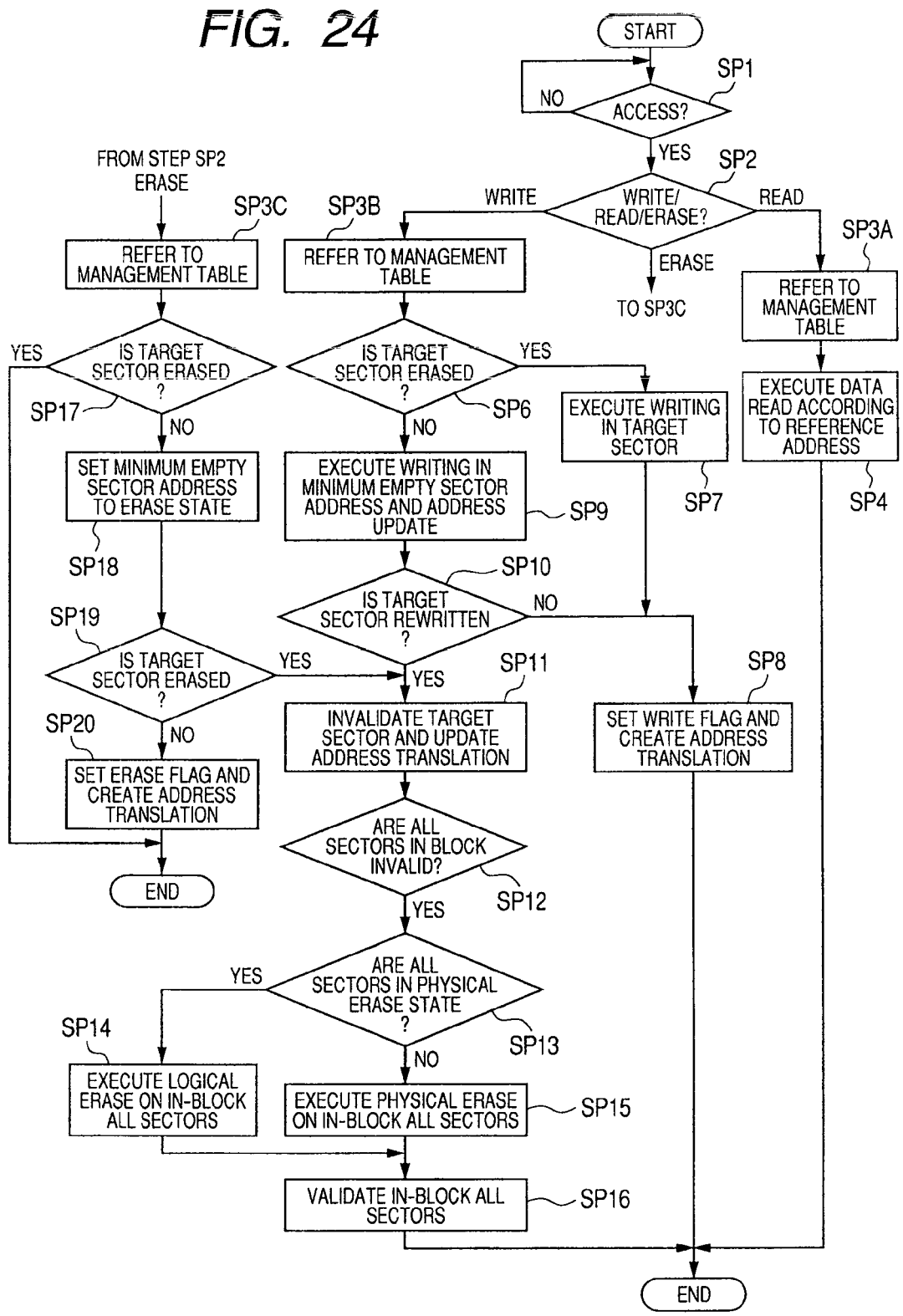
FIG. 24 is a flow chart illustrating a data access operation of the non-volatile semiconductor memory device according to the second embodiment of the present invention.

FIG. 24 is a flow chart showing the operation at data access, of the non-volatile semiconductor memory device according to the second embodiment of the present invention. The operations of the block/sector management table 110 and non-volatile semiconductor memory device shown in FIGS. 22 and 23 will be explained below with reference to FIG. 24.

The control circuit 122 shown in FIG. 23 monitors whether an access request has been given by the command CMD (Step SP1).

When the access request is given, the control circuit 122 determines whether the command CMD is of a read command indicative of the reading of data, a write command for designating the writing of data or an erase command for instructing the erasing of data (Step SP2). When the command CMD is of the read command indicative of the data reading, the control circuit 122 refers to the management table 110 (Step SP3A), and reads a physical address from the physical address storage area 112 of the block/sector management table 110 with the given address signal AD as a logical address and supplies it to the row selection drive circuits RSD0 through RSDm and column selection circuit 128 via the multiplexer 126 (Step SP4). Thus, the row selection drive circuits RSD0 through RSDm and the column selection circuit 128 perform the operation of selecting a row and a column in accordance with the given physical address and performs the reading of data from the corresponding memory cell.

In a manner similar to the first embodiment, the selected voltage is set according to the erase state at the corresponding row selection drive circuit in each memory block unit. A world line read voltage (read criterion voltage) is set upon erasing/writing. By performing the reading of data simply, the row selection drive circuit transmits the voltage corresponding to the erase state onto its corresponding selected word line.

When the command CMD designates writing or erasing, the control circuit 122 refers to the block/sector management table 110 (Steps SP3B and SP3C). Upon this reference to the management table, the control circuit 122 reads the corresponding physical address with the given address signal AD as the logic address. Further, the control circuit 122 refers to the block/sector management unit 110B in accordance with the read physical address to read the corresponding erase state flag EF, sector status flag SVF and block status flag BVF together.

When it is determined at Step SP2 that the command CMD is of the write command indicative of the writing of data, the control circuit 122 determines in accordance with the erase state flag EF, sector status flag SVF and block status flag BVF subjected to the reference at Step SP3B whether the corresponding sector designated by the logical address is in the erase state (Step SP6). This is discriminated by judging whether the sector status flag SVF is valid and indicates the write state. When the sector designated by the logical address is in the erase state, data writing is executed without performing an erasure relative to the target sector designated by the logical address (Step SP7).

Next, a write flag for the target sector on which this writing has been performed, is set and the correspondence between the logical address and the physical address is generated (Step SP8), followed by completion of writing.

When the target sector is in the write state, the control circuit 122 sets a coupling path of the multiplexer 126 so as to select the pointer generated by the write pointer 124 as a write address. The writing of data to the corresponding sector for the minimum address, of the free or available sectors or sectors held in the non-write state is executed by the row selection drive circuits RSD0 through RSDm in accordance with the pointer from the write pointer 124 (Step SP9).

Upon this data writing, the control circuit refers to the block status flag BVF in the corresponding memory block containing each sector designated by the write pointer 124. Since the logical erase and the physical erase are executed in memory block units, the erase state of the corresponding sector designated by the write pointer is also of the logical erase state or the physical erase state if the memory block containing the sector designated by the write pointer 124 is in the logical erase state or the physical erase state. Thus, no erase operation is executed and write and verify corresponding to the logical erase or the physical erase are executed. After the completion of the data writing, the pointer of the write pointer 124 is updated by 1 (Step SP9).

When the sector status flag for the read physical address is in the write state, the rewriting of stored data of the sector (sector intended or targeted for writing) designated by the logical address is done (Step SP10). Thus, the flag SVF for the rewritten sector is set to an invalid state at the block/sector management unit 110B (Step SP11). On the other hand, when writing into a new sector is done, the sector status flag SVF corresponding to a physical address indicated by the write pointer is set to the write state (Step SP8).

A pointer from the write pointer 124 is stored in the physical address storage area 112 in association with the logical address as its corresponding physical address (Step SP11).

Next, the block status flag BVF is monitored and determination as to whether all sectors of each memory block containing the target sector, i.e., the pre-rewriting sector designated by the logical address are set to the invalid state is performed (Step SP12). When all sectors lying in this block are set to the invalid state, that is, the block status flag BVF is set to the invalid state, it is determined whether all sectors in the memory block are in the physical erase state (Step SP13). Namely, this determination is executed by judging the flags EF indicative of the logical/physical erase states of all corresponding sectors in the erase state flags EF or judging the eraser state indicated by each block status flag.

When all sectors in the block are placed in the invalid state or the physical erase state, the logical erase is executed on all the sectors in the block (Step SP14). Next, the erase state flag EF for the corresponding sector and the block status flag BVF are respectively set to a state indicative of the logical erase state, and the corresponding sector status flag SVF and block status flag BVF are respectively set to the valid state.

On the other hand, when it is determined at Step SP13 that all the sectors in the block are not placed in the physical erase state, all the sectors in the block are in the logical erase state and placed in the invalid state. In this case, the physical erase is executed on all the sectors in the corresponding block (Step SP15). Thereafter, the sector status flag SVF is set to the invalid/no-write state with respect to all the sectors in the physically-erased block, and the erase status flag EF is set to a state indicative of the physical erase state. Further, the block status flag BVF is set to values indicative of the valid state and the physical erase state.

On the other hand, when it is determined at Step SP5 that the erase has been designated, the logical erase and the physical erase are executed in block units. Therefore, the physical address corresponding to the logical address given from the physical address storage area 112 is first read together with its corresponding flag. When the sector status flag SVF of the read physical address is in the valid/non-write state (Step SP17), each designated sector is in the erase state. Therefore, subsequent erasing is not done and the erase operation is completed.

On the other hand, when the sector status flag SVF of the read physical address is in the valid/write state, the erasure of stored data of each sector (sector intended for erasing) designated by the logical address is taken. In this case, access to the minimum free sector address designated by the write pointer, is executed (Step SP18). The corresponding sector designated by the write pointer is of the minimum free or available address and placed in the non-write state. Thus, no erasing is done actually and address translation is simply conducted. Then, when erasing for each sector placed in the write state is taken (Step SP19), the above operation proceeds to Step SP11, where processing similar to that at writing is executed.

On the other hand, when erasing for each new sector is taken, the sector status flag SVF corresponding to each physical address designated by the write pointer is set to a valid erase state (Step SP20). The erase state flag is set to a value indicative of an erase state and the pointer given from the write pointer 124 is stored in its corresponding physical address storage area 112 in association with the logical address as the corresponding physical address. Since each newly-erased area (sector) is in the erase state, it is of a free or available area and the write pointer is not updated.

As described above, the addresses for rewriting sectors are sequentially updated in accordance with the pointer of the write pointer 124 using the block/sector management table to execute data rewriting. Consequently, the data writing is always simply conducted upon writing without performing erasing. Accordingly, high-speed writing can be realized.

Since the number of times that the physical erase is done is reduced, power consumption can be reduced and degradation of the reliability of each memory cell can be avoided.

As the configurations of the internal voltage generating circuit 120 and the control circuit 122, the configurations of the internal voltage generating circuit 3 and the control circuit 4 according to the first embodiment shown in the previous FIG. 13 can be utilized. Configuring a main controller or control circuit in the control circuit 4 by a sequence controller makes it possible to execute the operation flowchart shown in FIG. 24. An EEPROM or register file can be utilized as the management table 110 in a manner similar to the first embodiment.

Figure 25:
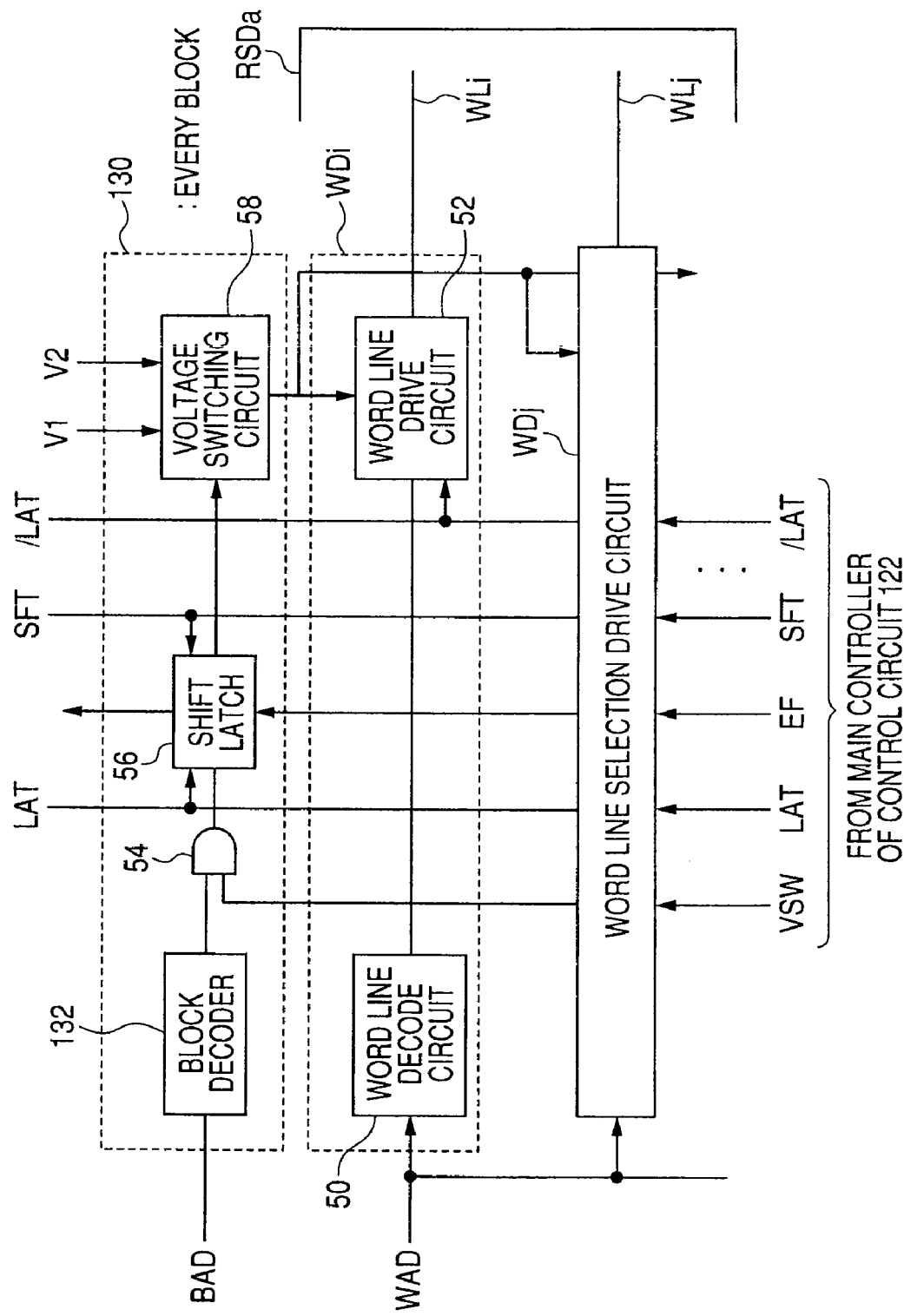
FIG. 25 is a diagram schematically showing a configuration of a row selection drive circuit of the non-volatile semiconductor memory device according to the second embodiment of the present invention.

FIG. 25 is a diagram schematically showing one example of a configuration of a voltage switching circuit 130 contained in each row selection drive circuit according to the second embodiment of the present invention. A configuration of one row selection drive circuit RSDa is typically shown in FIG. 25. The row selection drive circuit RSDa includes word line selection drive circuits WD (WDi and WDj) provided corresponding to word lines WL (WLi and WLj) respectively. Since the word line selection drive circuits WD (WDi and WDj) respectively have the same configuration, the word line selection drive circuits WDi and WDj provided with respect to the word lines WLi and WLj contained in the row selection drive circuit RSDa are typically shown in FIG. 25. The configuration of the word line selection drive circuit WDi is typically shown as its internal configuration.

The word line selection drive circuit WDi includes a word line decode circuit 50 which decodes a word line address signal WAD, and a word line drive circuit 52 which transmits a voltage onto its corresponding word line WLi in accordance with a decode signal outputted from the word line decode circuit 50 and an internal voltage outputted from the voltage selection or switching circuit 130. The voltage selection circuit 130 is provided in common to the word line selection drive circuit contained in the row selection drive circuit RSDa every memory block.

The voltage selection circuit 130 includes a block decoder 132 which decodes a block address signal BAD, a gate circuit 54 which receives an output signal of the block decoder 132 and a voltage switching signal VSW, a shift latch 56 which latches an output signal of the gate circuit 54 therein, and a voltage switching circuit 58 which selects one of internal voltages V1 and V2 in accordance with a latch signal of the shift latch 56.

Namely, the voltage selection circuit 130 utilizes, as a block selection signal, the block decode signal outputted from the block decoder 132 as an alternative to the word line decode circuit 50 in the configurations of the voltage switching units provided corresponding to the respective word line selection drive circuits in the first embodiment. The voltage switching signal VSW supplied to the gate circuit 54 is generated from the main controller (refer to the first embodiment) contained in the control circuit 122 when all sectors lying in this memory block are set to an invalid state in a manner similar to the first embodiment. When the logical erase is executed by voltage switching, a latch designation signal LAT is supplied. The word line drive circuit 52 is brought to a non-operating state upon activation of its complementary latch designation signal /LAT in like manner.

At power-on or system reset in a manner similar to the first embodiment, erase state flags EF stored in the order of physical addresses are sequentially shifted and stored in this block/sector management table 110, and a coupling form of the voltage witching circuit 58 is set to the shift latch 56. The updating of each erase state at actual processing is executed in a manner similar to the first embodiment.

According to the second embodiment of the present invention as descried above, when the logical erase is performed in each memory block unit, and all sectors in one block are set to the invalid state, erasing in each block unit is executed. The writing is executed on each sector placed in the non-write state, which has been set as the valid state. Thus, the time necessary for erasing can be shortened and power consumption necessary for erasing can be reduced. Even when the erase unit is large as in the case of the memory block (well unit), the writing in each sector unit can be conducted. Thus, even when rewriting is frequently performed like data or the like, the writing of data to the flash memory can be executed at high speed and low power consumption even at the flash memory with the data stored therein.

The block/sector management table may be realized using an EEPROM outside the flash memory block in a manner similar to the first embodiment. It may be realized as a register file within the flash memory (in this case, a management data storage area is provided for exclusive use in a specific area lying within the memory cell array 100).

Even in the second embodiment, threshold voltage distributions of data stored in each memory cell may be provided in large numbers like 4 or 8. Even in this case, the logical erase can be executed (N−2) times where each memory cell can store N-value data therein. As a control form in this case, the configuration of the modification of the first embodiment can be utilized (write control based on each sector unit is performed as an alternative to write control based on each word line unit, and erasing is executed in memory block units).

Third Embodiment

Figure 26:
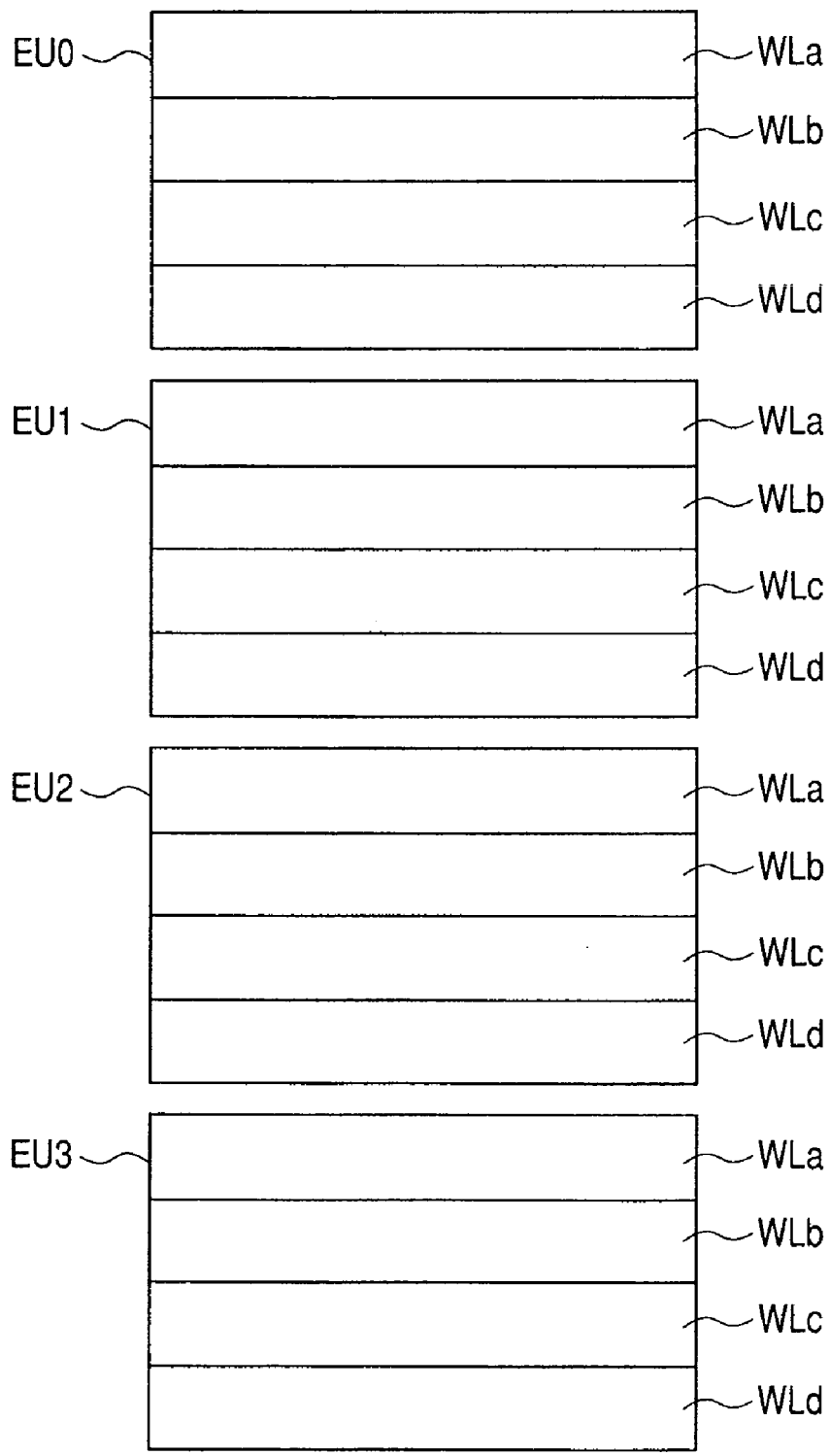
FIG. 26 is a diagram schematically illustrating one example of a configuration of a memory cell array in a non-volatile semiconductor memory device according to a third embodiment of the present invention.

FIG. 26 is a diagram schematically showing a configuration of a memory cell array of a non-volatile semiconductor memory device according to a third embodiment of the present invention. In FIG. 26, the memory cell array 140 is divided into a plurality of erase units EU. FIG. 26 shows, as one example, where the memory cell array 140 is divided into four erase units EU0 through EU3. These erase units EU0 through EU3 may be memory cell blocks. Further, they may be well regions separated from each other or sectors.

Each of the erase units EU0 through EU3 includes word lines WLa through WLd as rewriting or reprogramming units. The rewriting of data is executed in word line units as an alternative to the sectors SCR employed in the second embodiment.

FIGS. 27 through 30 are respectively diagrams typically showing data rewriting sequences of the non-volatile semiconductor memory device according to the third embodiment of the present invention. The data rewriting sequences of the non-volatile semiconductor memory device according to the third embodiment of the present invention will be explained below with reference to FIGS. 27 through 30.

Figure 27:
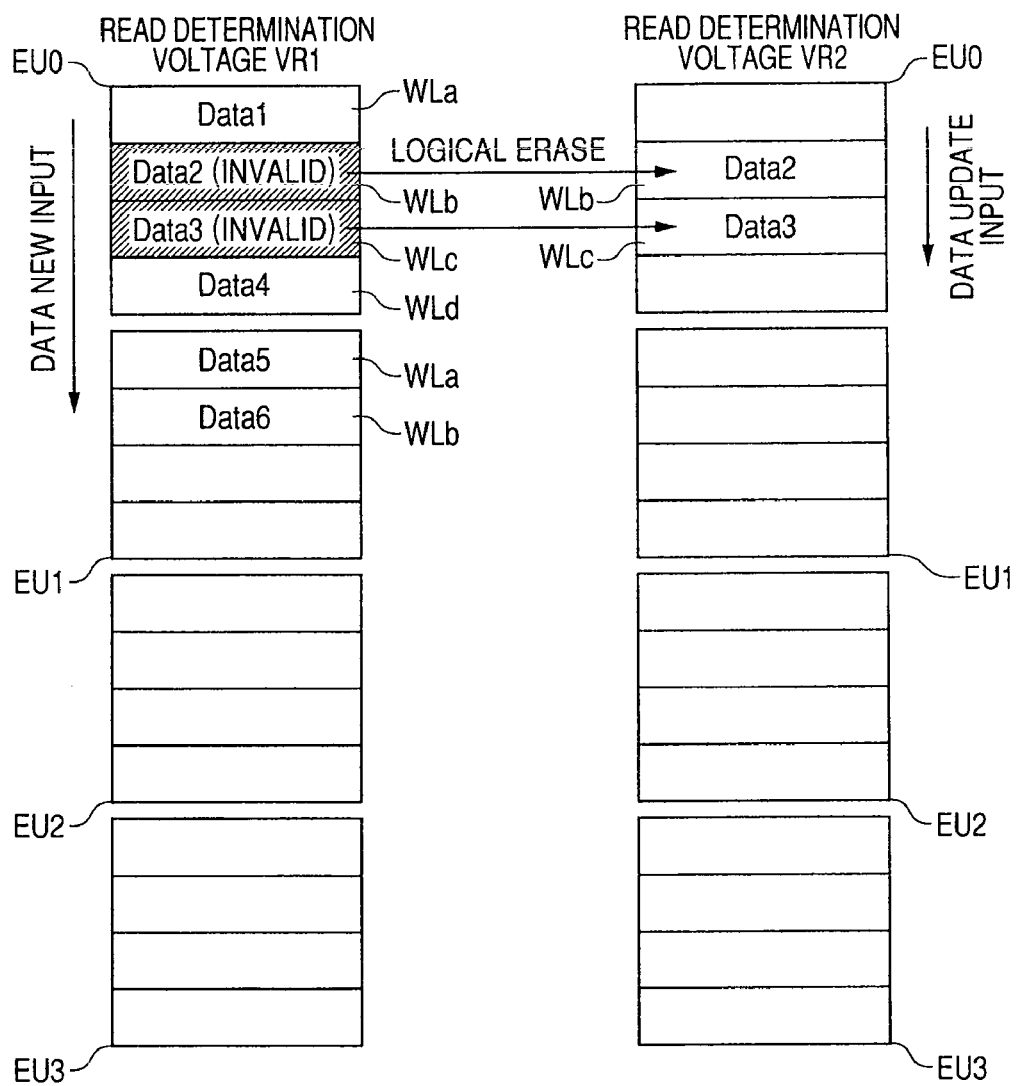
FIG. 27 is a diagram showing a data write operation sequence of the non-volatile semiconductor memory device according to the third embodiment of the present invention.

In FIG. 27, the writing of data is sequentially executed from the erase unit EU0 corresponding to the minimum address in the erase units EU0 through EU3. In FIG. 27, data Data1 through Data6 are sequentially stored in the erase units EU0 and EU1 every word line. When the rewriting of the data Data2 and Data3 stored in the word lines WLb and WLc of the erase unit EU0 is executed, a logical erase is executed on the word lines WLb and WLc of the erase unit EU0. Thereafter, a read determination voltage is updated from a voltage VR1 to a voltage VR2, and writing is executed on the word lines WLb and WLc of the erase unit EU0.

Upon reading of data of memory cells coupled to the word lines WLb and WLc, the read determination voltage is set to the voltage VR2. Subsequently, upon writing of new data, addresses are sequentially updated and the writing of data to non-written word lines is executed. Upon the renewal or updating of data, the logical erase is performed, and it is executed on each original word line.

Figure 28:
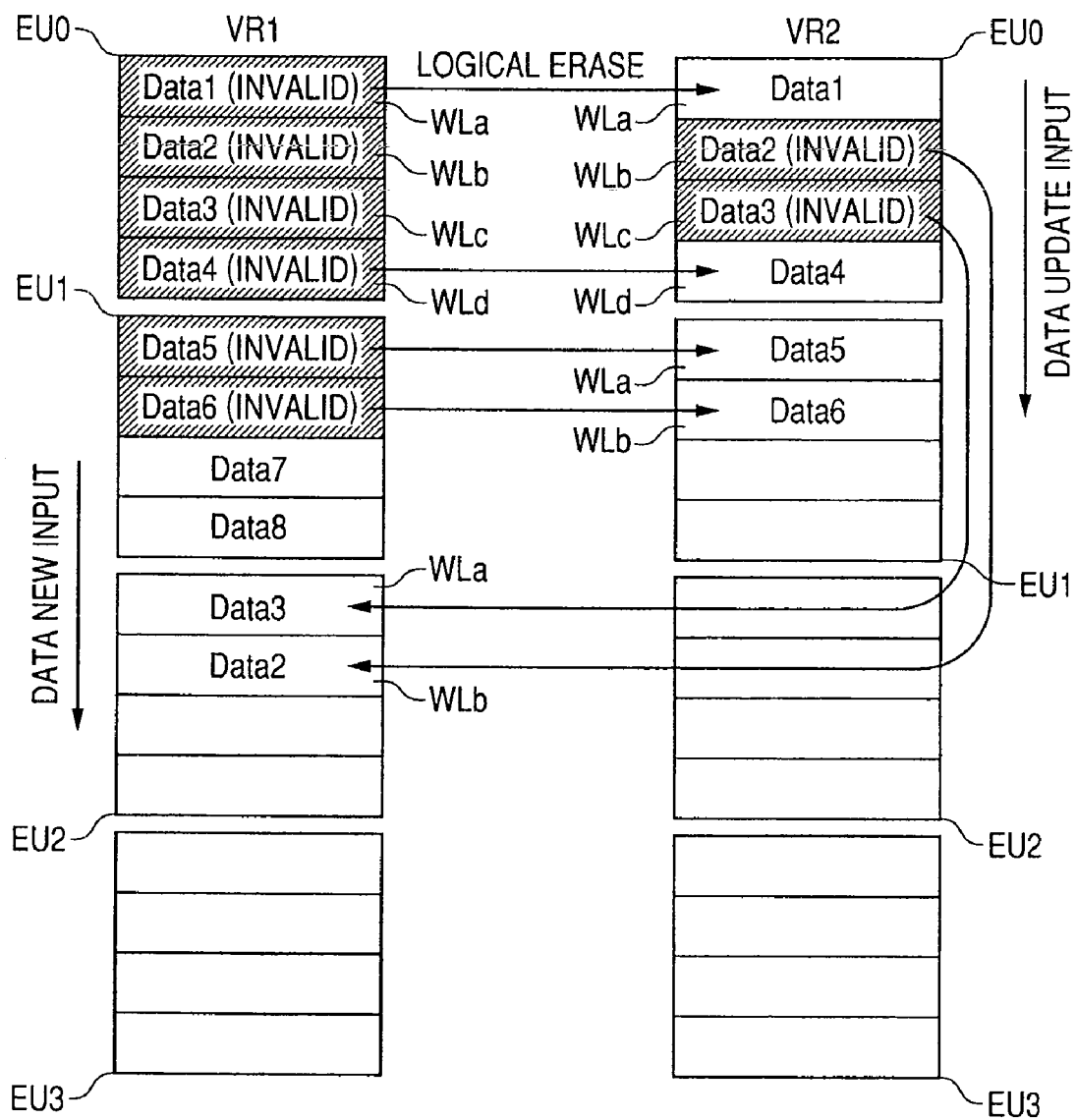
FIG. 28 is a diagram typically illustrating a data write sequence of the non-volatile semiconductor memory device according to the third embodiment of the present invention.

Next, as shown in FIG. 28, the re-rewriting of the data Data2 and Data3 stored in the word lines WLb and WLc of the erase unit EU0 on which the logical erase has been executed is executed. In this case, the word lines WLb and WLc placed in a logical erase state are respectively set to an invalid state. Data Data3 and Data2 based on the data given sequentially respectively are written into the word lies WLa and WLb of the erase unit EU2 corresponding to the minimum address of each non-written word line. A read determination voltage for each word line on which first writing is performed, i.e., each word line on which the writing of new data is performed in a physical erase state, is of the voltage VR1.

Figure 29:
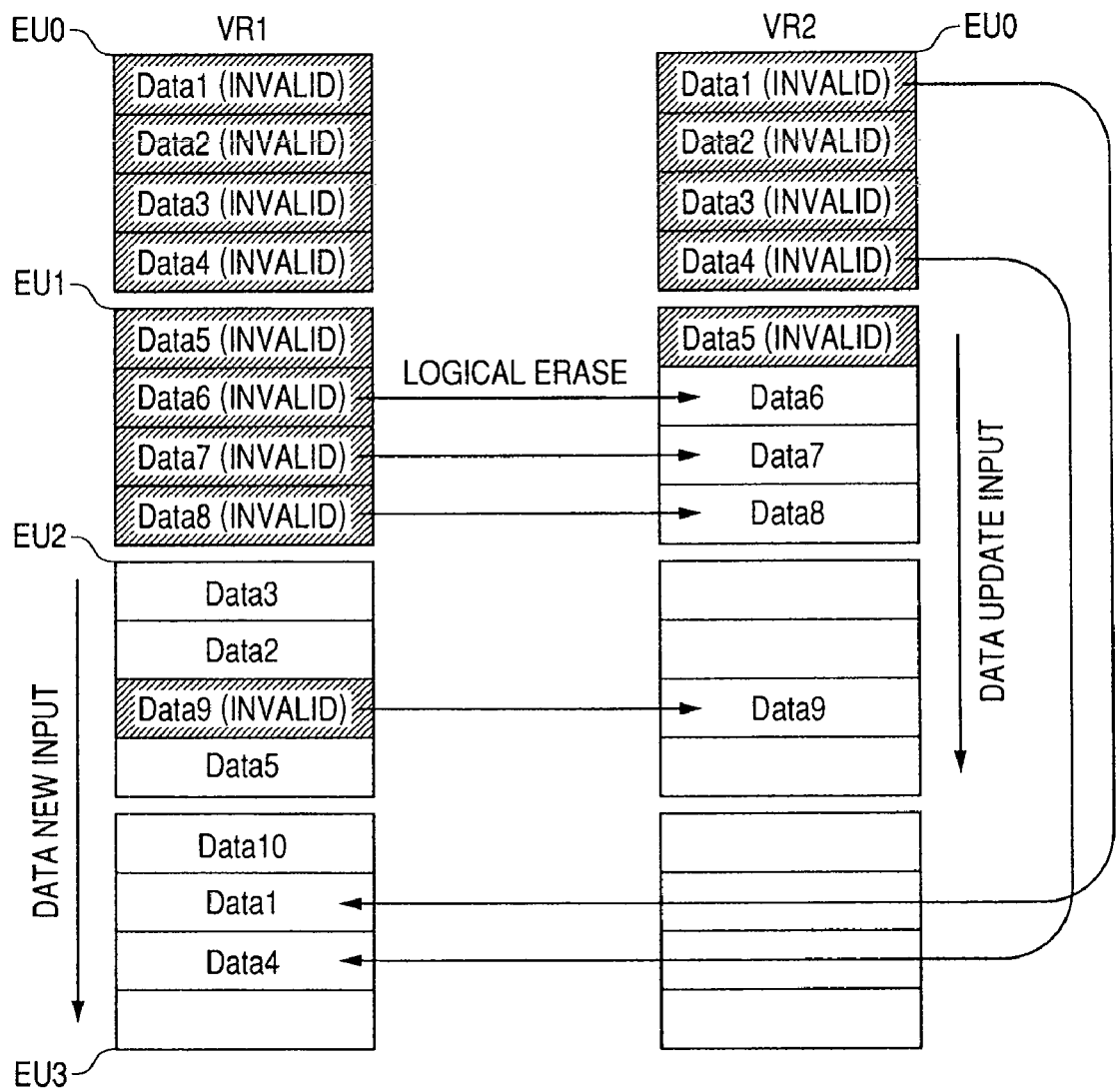
FIG. 29 is a diagram typically depicting a data write sequence of the non-volatile semiconductor memory device according to the third embodiment of the present invention.

Upon re-writing (updating) of data sequentially subsequently, the logical erase is executed to perform the rewriting of data where the logical erase can be performed, that is, where the writing of data is executed on each word line intended for rewriting after the physical erase state. On the other hand, when each word line intended for rewriting is in the logical erase state and rewriting is being executed, its corresponding word line is set to the invalid state and the writing of data is newly executed on the corresponding word line related to the minimum address, of the word lines placed in the non-written state. FIG. 29 shows a state in which the data Data1 through Data5 are rewritten or reprogrammed, their corresponding word lines are respectively set to the invalid state and data are written to other word lines placed in the non-written state. The data Data6 through Data8 are respectively written into memory cells coupled to the original word lines after the logical erase of each corresponding word line in the erase unit EU1 has been performed.

On the other hand, in the erase unit EU2, the rewriting of data Data9 is executed and the logical erase is executed so that new data Data9 is stored therein. The original word lines are placed in the logical erase unit and there is further a need to write data. Thus, the data Data1 and Data 4 are written into their corresponding word lines each corresponding to the minimum address, of new non-written word lines.

By repeating the invalidation of the word lines after re-writing by the logical erase and re-writing by the physical erase, i.e., the word lines placed in the logical erase state, the word lines are all brought to the state of being set to the invalid state at one erase unit. That is, as shown in FIG. 29, the word lines of the erase unit EU0 are all brought to the invalid state.

Figure 30:
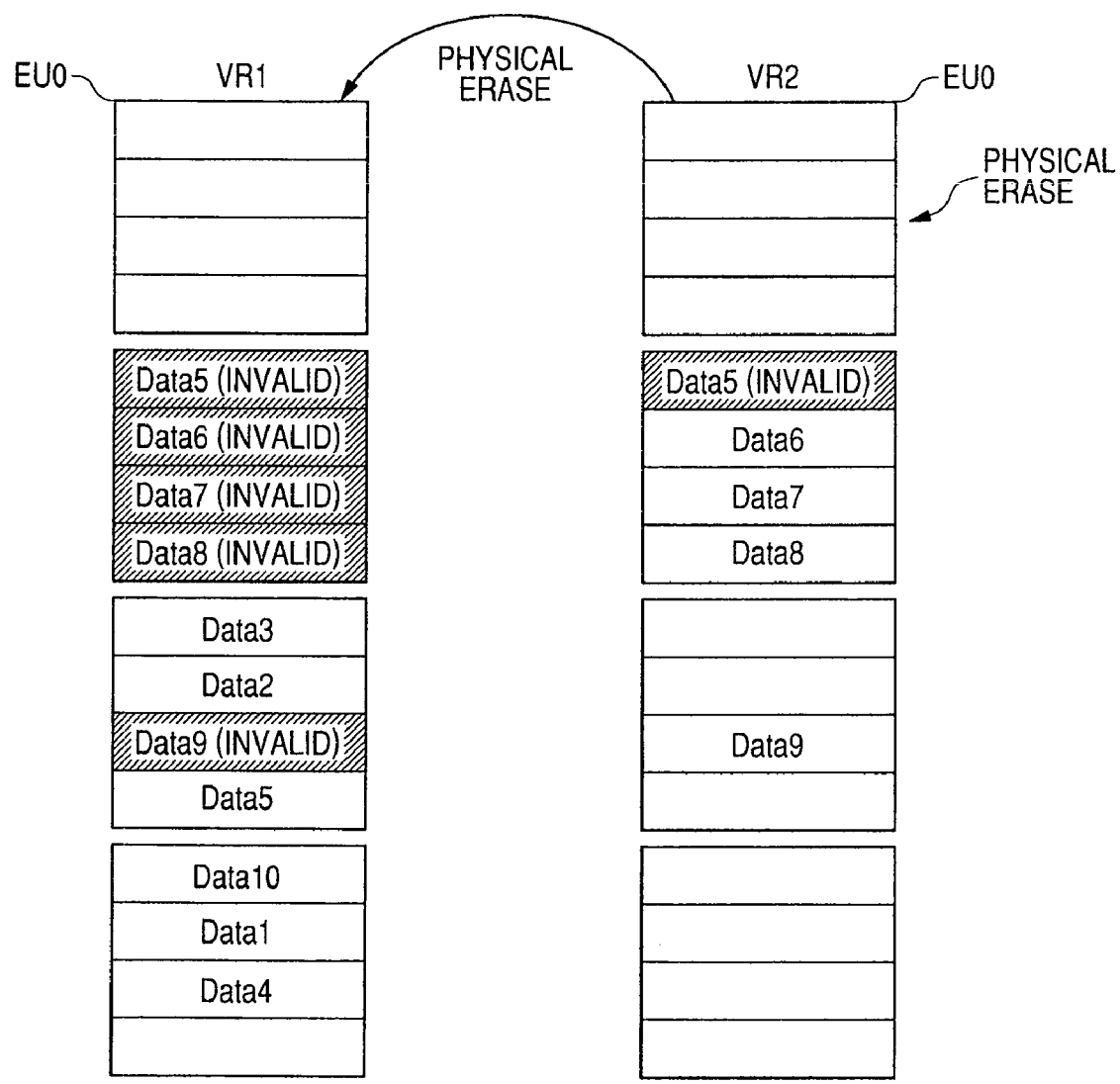
FIG. 30 is a diagram typically showing a data write sequence of the non-volatile semiconductor memory device according to the third embodiment of the present invention.

In this case, as shown in FIG. 30, the physical erase is performed at the erase unit EU0. The word lines contained in the erase unit EU0 are all changed to the valid and non-written state. Subsequently, upon the writing of new data or rewriting of data to each word line in the logical erase state, the writing of data is executed using each word line lying in the erase unit EU0 brought to the non-written state newly.

In this case, the consumption of the word lines in each erase unit, i.e., writing/rewriting is dispersed to determination voltages (word line read voltages) VR1 and VR2. Thus, the erasing of the word lines in each erase unit can be carried out twice and the number of the word lines in each erase unit can be doubled. Accordingly, the rewriting of the data can be executed in each memory area having small memory capacity. The non-volatile semiconductor memory device having each small memory area as a data area can be utilized.

Figure 31:
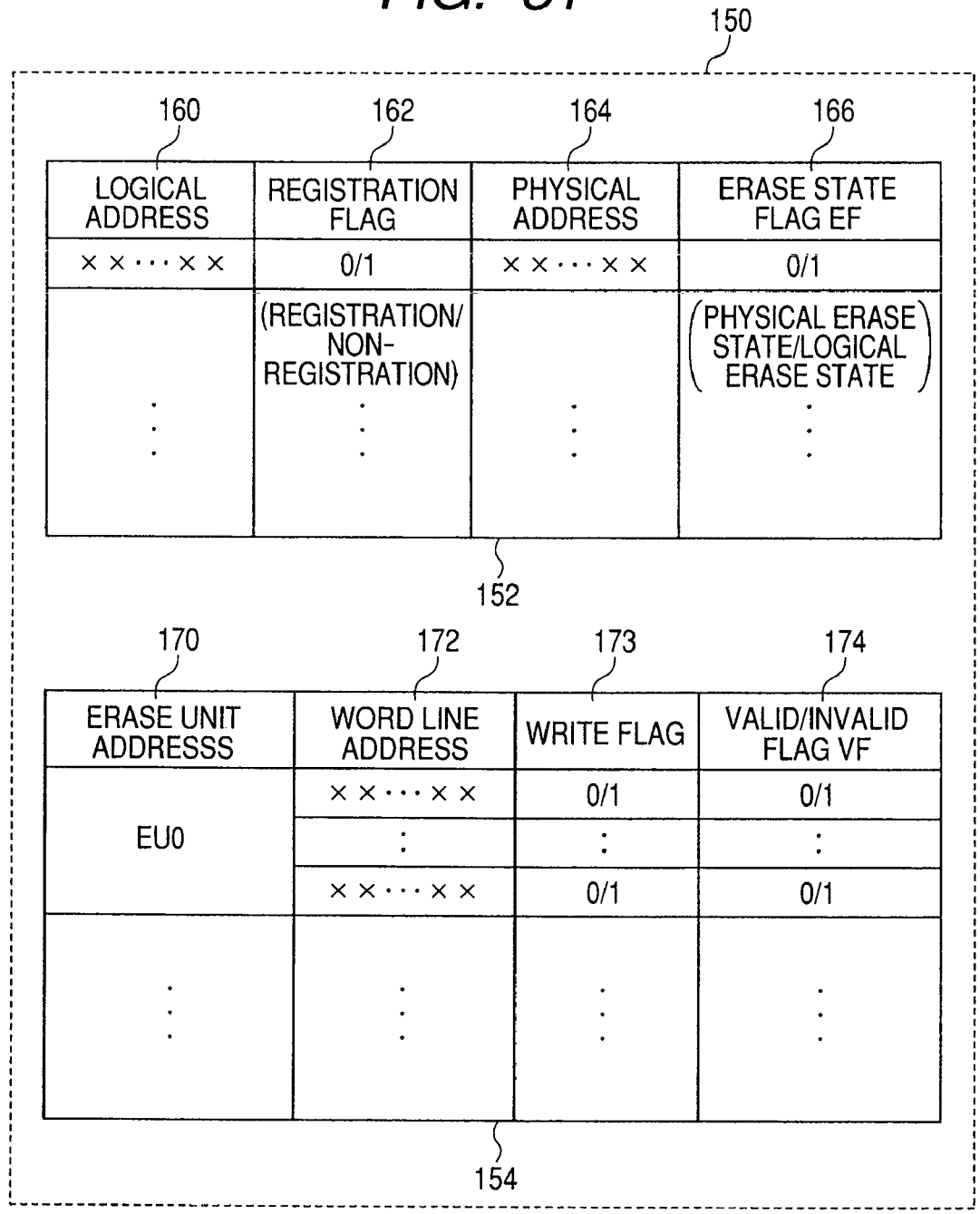
FIG. 31 is a diagram illustrating one example of a configuration of a management table employed in the non-volatile semiconductor memory device according to the third embodiment of the present invention.

FIG. 31 is a diagram schematically showing a configuration of a management table used in the third embodiment of the present invention. In FIG. 31, the management table 150 includes a physical address management table 152 and an erase unit management table 154. The physical address management table 152 includes a logical address storage area 160, a registration flag storage area 162, a physical address storage area 164 and an erase state flag storage area 166. A logical address, a registration flag RF, the present physical address corresponding to the logical address, and a flag EF indicative of an erase state of the physical address are stored in each area as one entry in association with one another. The logical address is of an address given from a processor in a manner similar to the previous first embodiment. The physical address is of an address indicative of a word line position lying within each memory.

The registration flag RF indicates whether the writing of data with respect to each logical address stored in the logical address storage area 160 has been required. The erase state flag EF indicates whether the corresponding word line indicated by the physical address is in a state in which a physical erase has been performed or a state in which a logical erase has been carried out.

The registration flag RF indicates that when it is unregistered, the corresponding logical address is not yet used. When the registration flag RF indicates a registration state, the present physical address corresponding to its logical address is stored in the physical address storage area 164. Thus, the writing of data is executed on the physical address. In this case, the corresponding word line is in either the state (physical erase state) in which the physical erase has been performed or the state (logical erase state) in which the logical erase has been performed. Thus, when the logical address is given, the corresponding physical address indicates the rewriting of data on each word line indicates by the physical address where the registration flag RF is set to and stored in the physical address erase management table 152. At this time, the operation rewriting into each word line area indicated by the physical address or the writing of data to each word line indicated by another new physical address is selectively executed according to whether the corresponding erase state flag EF is indicative of either one of the physical erase state and the logical erase state.

The erase unit management table 154 includes an erase unit address storage area 170, a word line address storage area 172, a write flag storage area 173 and a valid/invalid flag storage area 174. Respective addresses (for example, block addresses or sector addresses) of the erase units EU0, . . . are stored in the erase unit address storage area 170. Addresses for word lines contained in their corresponding erase units are stored in the word line address storage area 172 every erase unit. Flags each indicative of a state in which the writing of data has been performed on each word line lying in the erase unit or an erase state are stored in the write state flag storage area.

Valid/invalid flags VF each indicative of a valid state of each word line, i.e., whether each word line is storing valid data or being set to an invalid state, are stored in the valid/invalid flag storage area 174 in association with the respective word line addresses. Here the valid data indicates a state in which memory cell data on each word line indicated by the logical address can be read as it is. The invalid state indicates a state in which re-writing is performed on each corresponding word line in the logical erase state, and data indicated by the logical address is written into another word line by address translation.

When the word line addresses in each erase unit are all set to the invalid state by the valid/invalid flags VF respectively using the erase unit management table 154, the physical erase relative to each erase unit is executed.

Figure 32:
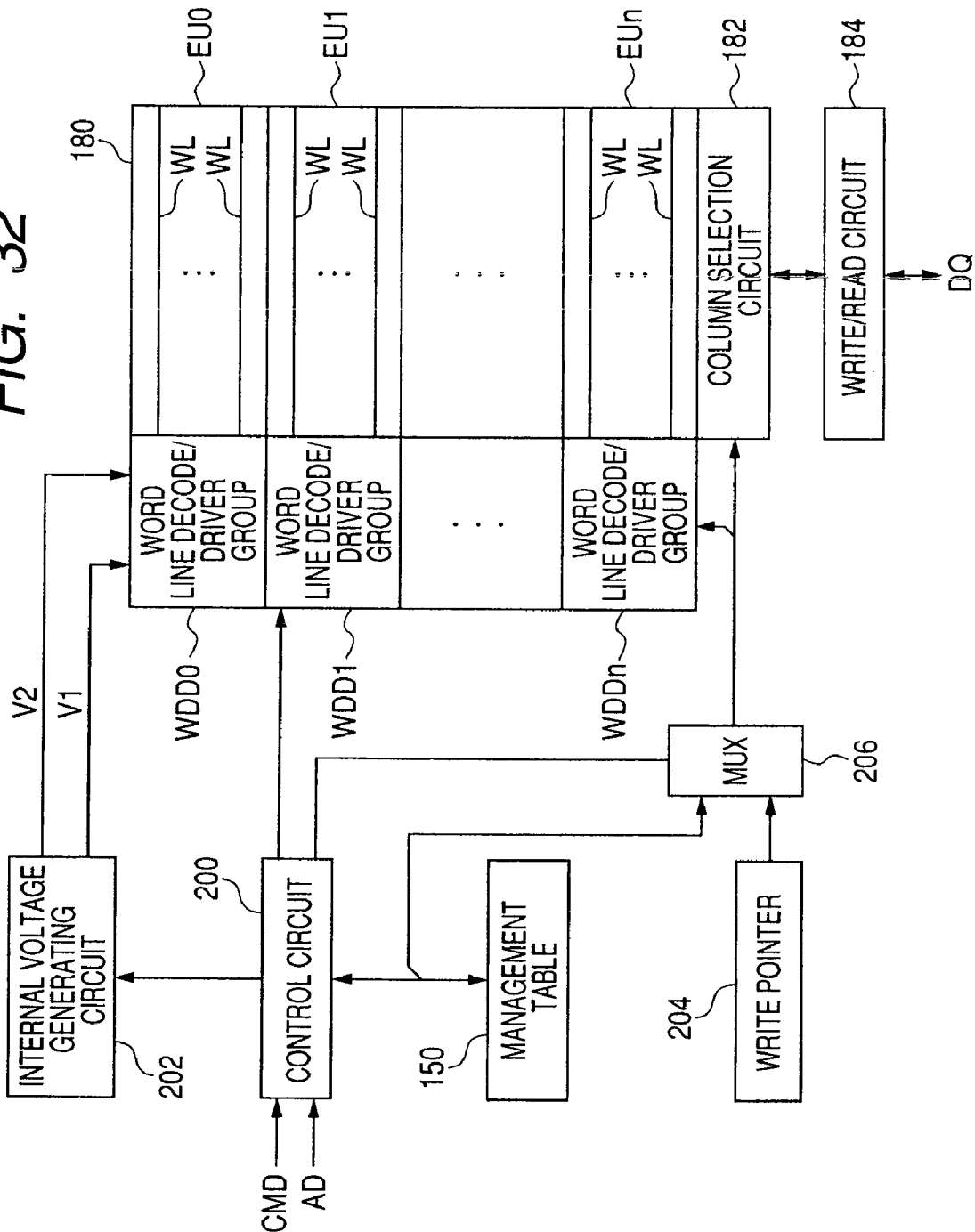
FIG. 32 is a diagram schematically showing an overall configuration of the non-volatile semiconductor memory device according to the third embodiment of the present invention.

FIG. 32 is a diagram schematically showing an overall configuration of the non-volatile semiconductor memory device according to the third embodiment of the present invention. In FIG. 32, a memory cell array 180 is divided into a plurality of erase units EU0 through EUn. A plurality of word lines WL are arranged in each of the erase units EU0 through EUn. Word line decode/driver groups WDD0 through WDDn are respectively provided corresponding to the erase units EU0 through EUn. The word line selection drive circuits shown in the first embodiment are respectively provided in the word line decode/driver groups WDD0 through WDDn in association with the word lines WL.

A column selection circuit 182 and a write/read circuit 184 are provided for the memory cell array 180.

The non-volatile semiconductor memory device is further provided with a control circuit 200 which controls each operation necessary for data access (reading/rewriting), an internal voltage generating circuit 202 which generates internal voltages V1 and V2 under the control of the control circuit 200, a write pointer 204 which generates a write address for new data, and a multiplexer (MUX) 206 which selects one of a pointer address outputted from the write pointer 204 and a physical address read from the management table 150 under the control of the control circuit 200.

In a manner similar to the previous first embodiment, the management table 150 may be provided outside a flash memory block and over the same semiconductor chip in the form of an EEPROM, for example. As in the case of the modification of the first embodiment, the management table 150 is comprised of a register file. Storage data thereof are stored in specific data areas of the memory cell array 180. At power-up, the data at the specific data areas of the memory cell array may be initially set to the management table 150.

A concrete configuration of the inside of the control circuit 200 is similar to the configuration of the control circuit employed in the first embodiment shown in the previous FIG. 13. Rewriting and a sequence for selecting each new data write word line are simply different from the first embodiment.

Figure 33:
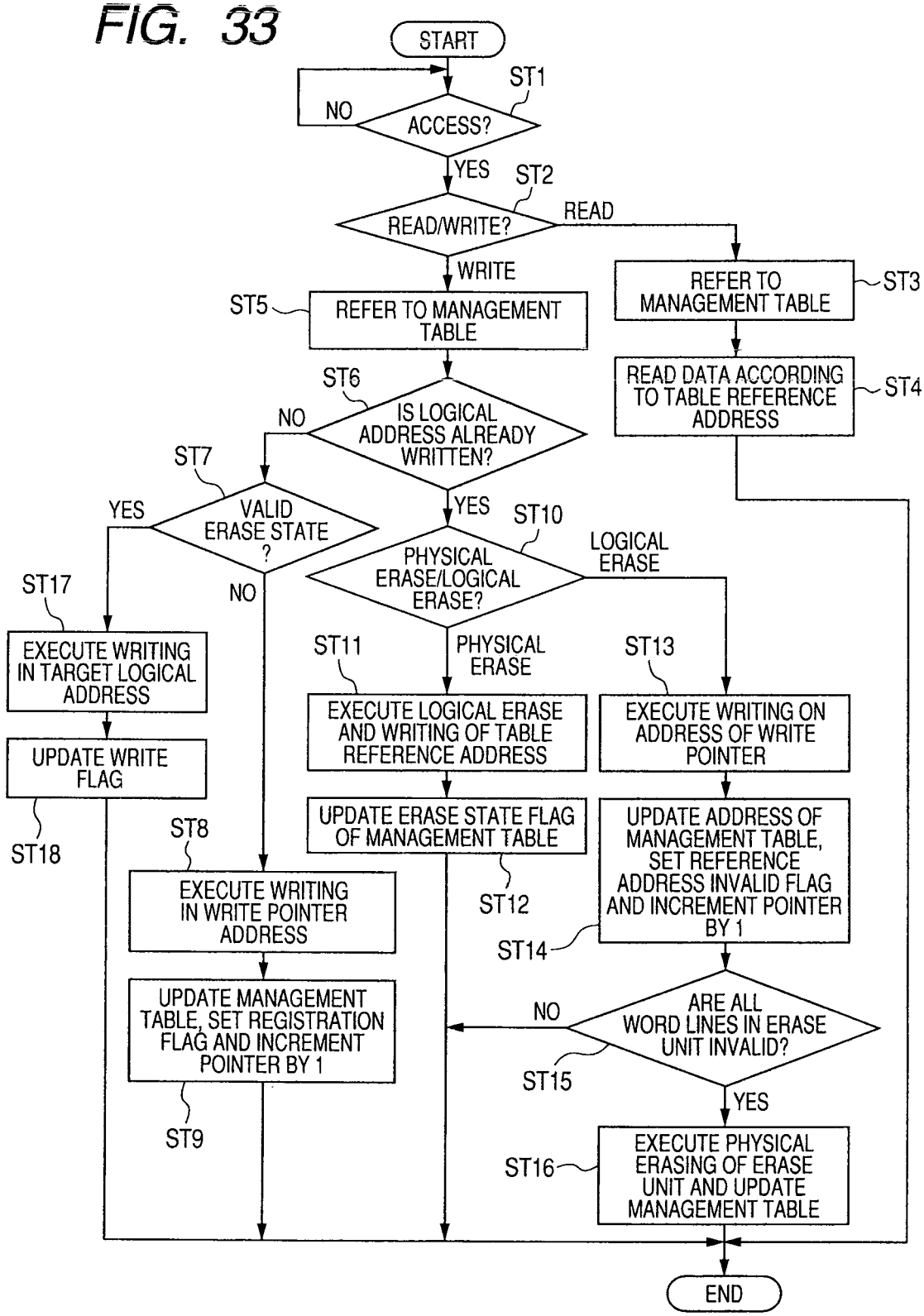
FIG. 33 is a flow chart illustrating a data access sequence of the non-volatile semiconductor memory device according to the third embodiment of the present invention.

FIG. 33 is a flow chart showing the operations at data writing and reading, of the non-volatile semiconductor memory device according to the third embodiment of the present invention. Data access operations of the non-volatile semiconductor memory device shown in FIGS. 31 and 32 will be explained below with reference to FIG. 33.

The control circuit 200 waits for the supply of a command CMD from the processor (microcomputer) (Step ST1). When the command CMD is given, the control circuit 200 identifies whether the command CMD outputted from the processor is of either a read command indicative of data reading or a write command indicative of data writing (Step ST2).

When the read command is given, the control circuit 200 refers to the physical address management table 152 of the management table 150 and thereby reads a physical address corresponding to a logical address indicated by an address signal AD outputted from the processor (Step ST3). When the data reading is given from the processor, the data has already been written into an area for the logical address indicated by the address signal AD. Thus, in this case, a physical address (table reference address) read from the management table is supplied to the word line decode/driver groups WDD0 through WDDn and column selection circuit 182 via the multiplexer 206 and the reading of data in the selected memory cell is executed (Step ST4). At this time, reference may be made to a registration flag and valid/invalid flags to confirm that valid data is being stored.

When the command CMD is of the write command indicative of the data writing, the control circuit 200 refers to the management table 150 (Step ST5). In this case, the control circuit 200 first reads the corresponding registration flag RF of the physical address management table 152 contained in the management table 150 and identifies whether writing has already been performed on the logical address indicated by the address signal AD, that is, the logical address has already been accessed (Step ST6).

When the registration flag RF attached to the logical address indicated by the address signal AD from the processor indicates non-registration, writing is first executed on the logical address. Even if the registration flag has been registered, it might be placed in an erase state at each erase unit. In this case, the corresponding physical address is read and a decision as to whether the corresponding write flag is set to a write state is made (Step ST7). When the registration flag is in a non-registered state or the write flag is indicative of the write state, there is a need to write data into a new physical address. Thus, a pointer from the write pointer 204 is supplied to the column selection circuit 182 and word line decode/driver groups WDD0 through WDDn via the multiplexer 206. The writing of data is executed in accordance with the pointer indicated by the write pointer 204 (Step ST8).

Thereafter, when the registration flag is unregistered in the management table 152 along with the logical address, the corresponding registration flag is set to a registration state. A physical address in which data indicated at the logical address has been written, i.e., the pointer of the write pointer 204 is stored in the physical address management table 152 in association with the logical address. This case indicates the writing of data into the first area. The corresponding erase state flag EF is maintained in a state ("0", for example) indicative of a physical erase state. The write flag and valid/invalid flag are respectively set to values indicative of a write state and a valid state.

The pointer of the write pointer 204 is incremented by 1 (Step ST9). Thus, the writing of the new data is completed.

On the other hand, when it is determined at Step ST7 that the corresponding physical address area is in the valid erase state, it is in a non-written state under the erase state and the writing of data is conducted without performing an erase operation on a physical address designated by a target logical address (Step ST17).

The write flag for the physical address is set to the write state and the valid/invalid flag is maintained in the valid state (Step ST18).

On the other hand, when it is determined at Step ST6 in accordance with the registration flag RF and the write flag that the logical address has already been written, it is determined by reference to the corresponding erase state flag EF whether the area for the corresponding physical address is in a physical erase state or a logical erase state (Step ST10). In a manner similar to the previous first and second embodiments, the physical erase state in the registration state is of a state in which a physical erase has been done and the writing of data has been conducted. The logical erase state is of a state in which a logical erase has been done and the writing of data has been conducted. In this case, the latest physical address is set to the physical address management table 152 in association with the logical address. A data storage area indicated by the physical address is of an area in which valid data has been stored.

When the area indicated by the physical address associated with the logical address is in the physical erase state, the rewriting of data is taken, reference is made to the corresponding physical address stored in the physical address storage area 164 of the physical address management table 152 and a logical erase is executed on an area indicated by the physical address referred to from the table, followed by execution of data writing (Step ST11). Then, after the completion of this writing, the erase state flag EF of the physical address management table 152 is set to ("1", for example) indicative of the logical erase state (Step ST12).

On the other hand, when it is determined at Step ST10 that the area for the physical address associated with the logical address is in the logical erase state, the writing of data is executed on an area for a pointer address indicated by the write pointer 204 (Step ST13). Thereafter, the corresponding physical address of the management table 150, i.e., the physical address storage area 164 of the Physical address management table 152 is updated to the pointer address indicated by the write pointer, and the erase state flag EF is set to a value indicative of a physical erase state. Further, the valid/invalid flag VF attached to each word line address corresponding to the physical address is set to an invalid state in the erase unit management table 154. Thus, the writing of data to the corresponding non-written word line at another minimum address is stored upon the writing of data to each area placed in the logical erase state. The pointer address from the write pointer 204 is used and the pointer of the write pointer 204 is incremented by 1.

Next, it is determined whether valid/invalid flags VF at word line addresses in areas indicated by erase unit addresses are all set to an invalid state in the erase unit management table 154 (Step ST15). When all word lines in each erase unit are set to the invalid state, a physical erase is executed on its corresponding erase unit. Thereafter, the valid/invalid flags VF in the erase unit are all set to a valid state.

When all word lines in each erase unlit are not placed in the invalid state and at least one word line is placed in the valid state (valid write state or erase state), the write operation is completed.

By managing the erase states in the physical address units and managing the valid/invalid flag states in the erase units, the erase state can be set to different erase states, i.e., a physical erase state and a logical erase state in each word line unit lying in the erase unit.

Incidentally, when it is determined whether all word lines of each erase unit (EU0, for example) are set to the invalid state in the erase unit management table 154, the valid/invalid flags VF corresponding to the erase unit addresses are all read in parallel and AND and OR processes are executed, thereby making it possible to identify based on the above result of logical processing whether all are in the invalid state. Upon writing/reading of data in plural bit units of the erase unit management table 154, the updating of each valid/invalid flag VF can be executed in 1-bit units easily if a read modify write operation is utilized upon renewal of a 1-bit valid/invalid flag.

FIG. 34 is a flowchart showing an operation where an erase command is given. The operation at the application of the erase command will be explained below with reference to FIG. 34.

A waiting for the application of the erase command is first taken (Step ST20). When the erase command is applied, reference is made to the corresponding management table (Step ST21). It is determined by reference to a write flag and a valid/invalid flag whether an area designated for erasure is in a valid erase state (Step ST23). If the designated area is in the valid erase state, it is then unnecessary to further perform erasing, and the erase operation is completed.

On the other hand, when it is determined at Step ST22 that the designated area is not in the valid erase state, the writing of data is performed on a physical address designated by a given logical address. The erasing is done because a registration flag is set and designated to an area in which writing has been performed.

Next, a decision as to whether the designated area, i.e., the physical address (word line address) corresponding to the logical address is in a physical erase state or a logical erase state, is done by reference to each erase state flag EF (Step ST23). Upon the physical erase state, the corresponding address is set to the logical erase state in accordance with a table reference address (address read from the management table) (Step ST24), and the corresponding erase state flag of the management table is set to the logical erase state and the write flag is set to the erase state (Step ST25).

When it is determined at Step ST23 that the physical address is in the logical erase state, there is a need to perform a physical erase on the erase unit in each area designated by the corresponding physical address, and erasing is executed on each address designated by the write pointer (Step ST26).

In order to manage an erasure at the address of this altered destination, in the management table, the valid/invalid flag is set to an invalid state, the write flag for the physical address designated by the write pointer is set to an erase state, the valid/invalid flag is set to a valid state, and the erase state flag EF is maintained in an erase state set to the area designated by the write pointer. Further, the write pointer is incremented by 1 (Step ST27). At this time, the correspondence between the logical address and the physical address is updated in accordance with the pointer of the write pointer.

Next, a decision as to whether all word lines in each erase unit are set to the invalid state is done in a manner similar to the write operation (Step ST28). When all word lines in the corresponding erase unit are respectively placed in the invalid state, a physical erase in each erase unit is performed. Further, in the management table, the write flag is set to a non-written state and the valid/invalid flag is set to a valid state (Step ST29).

Even when the erase command is applied in the above-described manner, the execution of the logical erase, and the execution of the physical erase where all the word lines in each erase unit are brought to the invalid state, can be realized.

In the above description, the word lines contained in erase unit are indicated as the rewriting units. However, the third embodiment can be applied to such a configuration that the erase units are of memory cell blocks and the rewriting units are of sectors, and rewriting is collectively executed on a plurality of word lines.

When each memory cell is capable of storing N-value data more than or equal to the quaternary value, logical erases of (N−2) stages can be performed. Erase state flags of plural bits are utilized as in the case where the erase state flag EF is placed in any of (N−1) logical and physical erase states. When the erase state flag EF is brought to the maximum logical erase state, the corresponding word line is set to the invalid state and writing is executed on each new non-written word line. The physical erase in each erase unit is executed where all the word lines in the erase unit are respectively brought to the invalid state.

The threshold voltage distribution areas to be utilized may be set referring to the flags by using the configuration of the multivalued memory as the configurations of the internal voltage generating circuit 202 and the control circuit 200 shown in FIG. 32 (expanding the configuration of the modification of the first embodiment) and using the configuration of the multivalued data write control utilizing the sequence controller as the control circuit 200.

By performing voltage switching at each word line decode/driver group in a manner similar to the second embodiment, the logical erase based on each word line unit and the physical erase based on each erase unit can be realized. If the word lines are replaced by the sectors, then the configuration of the third embodiment can similarly be applied even to the configuration of rewriting in each sector unit and erasing in each block unit in the second embodiment.

According to the third embodiment of the present invention as described above, each of the memory cells is set to either one of the logical erase state and the physical erase state. Thus, the number of physical erases can be reduced and stress of each memory cell by the write operation can be reduced, thereby making it possible to suppress a reduction in reliability.

The rewriting unit areas can be utilized plural times and correspondingly the number of rewriting units in each erase unit can be increased. Accordingly, the memory capacity of each memory area is increased effectively. Thus, a memory system can be configured by small-sized memory areas, and a chip size and/or cost can be reduced.

Applying the present invention to a non-volatile semiconductor memory device makes it possible to realize a non-volatile semiconductor memory device capable of performing rewriting at high speed and low power consumption. With the application of the invention to a NOR type flash memory in particular, information reduced in the number of rewritings such as a program can be rewritten at high speed, and each area corresponding to a program size can be rewritten.

Rewriting can be executed in the word line units even in a NAND type flash memory. There is no need to set each non-selection word line to the same voltage level as a well potential for the purpose of this erase prevention. The rewriting of data can be performed at high speed without impairing the reliability of each memory cell.

As to the memory cell, data is stored therein according to the amount of electric charge accumulated in the floating gate. The present invention can be applied even to an insulating-film charge trap-type memory cell that stores data according to the accumulated amount of electric charge of an insulating film such as an ONO film (oxide film-nitride film-oxide film).

With the combination of the first and second embodiments and/or the third embodiment, the program area that stores the program therein and the data area that stores the data therein are arranged in the same memory cell array. The configuration based on the first embodiment is applied to the program area. The second or third embodiment is applied to the frequently-rewritten data area. Consequently, there can be realized a non-volatile semiconductor memory device capable of performing rewriting at high speed and low power consumption and suppressing a reduction in the reliability of each memory cell.

A non-volatile semiconductor memory device according to the present invention can be applied to a microcomputer built-in flash memory integrated on the same semiconductor chip as a processor. It is thus possible to suppress an increase in the chip size of the microcomputer and easily execute revision/modification of programs of various sizes corresponding to various applications.

What is claimed is:
1. A non-volatile semiconductor memory device comprising:

a memory cell array having a plurality of non-volatile memory cells, the memory cell array being divided into a plurality of first erase units respectively including a plurality of second erase units; and a control circuit which executes erase and write operations of each selected memory cell in the memory cell array in accordance with erase or write instructions, wherein the control circuit includes a first erase control unit which performs an erase in the first erase unit and a second erase control unit which performs an erase in the second erase unit, wherein the second erase control unit sets a voltage applied to the target memory cell at erasing smaller in absolute value than at erasing by the first erase control unit and makes short the time necessary for erasure, and wherein when the second erase unit including each selected memory cell is in a state in which erasing and writing are being done by the first erase control unit, the second erase control unit erases the second erase unit including the selected memory cell.

2. The non-volatile semiconductor memory device according to claim 1, wherein the memory cells of the memory cell array are arranged over a well region in matrix form, wherein the first erase units are of well units, and wherein the second erase units are of word lines arranged corresponding to memory cell rows.

3. The non-volatile semiconductor memory device according to claim 1, wherein the memory cell array is divided into a plurality of blocks each having sectors including a plurality of memory cell rows respectively, wherein the first erase units are of the blocks, and wherein the second erase units are of the sectors.

4. A non-volatile semiconductor memory device, comprising:

a memory cell array having a plurality of non-volatile memory cells, the memory cell array being divided into a plurality of first erase units respectively including a plurality of second erase units; and a control circuit which executes erase and write operations of each selected memory cell in the memory cell array in accordance with erase or write instructions, wherein the control circuit includes a first erase control unit which performs an erase in the first erase unit and a second erase control unit which performs an erase in the second erase unit, wherein the second erase control unit sets a voltage applied to the target memory cell at erasing smaller in absolute value than at erasing by the first erase control unit and makes short the time necessary for erasure, wherein the control circuit further includes a write control unit which executes writing on the second erase units each placed in a non-written state, of the memory cell array upon a state in which the addressed second erase unit is erased by the first erase control unit and data writing has been conducted thereby, and sets the addressed second erase unit to an invalid state, wherein the second erase control unit executes erasing by the second erase control unit on the first erase units when second rewrite units lying within the first erase units are all set to an invalid state, and sets the rewrite units in the first erase units to a valid state, and wherein the first erase control unit executes erasing of the first erase units under the first erase control unit when the second rewrite units lying in the first erase units are all invalidated after erasing thereof by the second erase control unit.

\* \* \* \* \*